(12) United States Patent
Fujita

(10) Patent No.: US 10,462,862 B2
(45) Date of Patent: Oct. 29, 2019

(54) LIGHT SOURCE CONTROL DEVICE AND IMAGE FORMING APPARATUS

(71) Applicant: Hayato Fujita, Kanagawa (JP)

(72) Inventor: Hayato Fujita, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/997,858

(22) Filed: Jun. 5, 2018

(65) Prior Publication Data

US 2018/0359829 A1    Dec. 13, 2018

(30) Foreign Application Priority Data

Jun. 8, 2017    (JP) .................. 2017-113774

(51) Int. Cl.
| | |
|---|---|
| H05B 33/08 | (2006.01) |
| G03G 15/043 | (2006.01) |
| H04N 1/113 | (2006.01) |
| G03G 15/00 | (2006.01) |
| G03G 15/01 | (2006.01) |

(52) U.S. Cl.
CPC ..... *H05B 33/0824* (2013.01); *G03G 15/0189* (2013.01); *G03G 15/043* (2013.01); *G03G 15/5058* (2013.01); *H04N 1/1135* (2013.01); *H05B 33/0851* (2013.01)

(58) Field of Classification Search
CPC .......................... H05B 33/0824; G03G 15/043
See application file for complete search history.

(56) References Cited

U.S. PATENT DOCUMENTS

| | | |
|---|---|---|
| 2012/0189328 A1 | 7/2012 | Suzuki et al. |
| 2012/0293783 A1 | 11/2012 | Ishida et al. |
| 2014/0139603 A1 | 5/2014 | Fujita et al. |
| 2014/0139605 A1 | 5/2014 | Fujita et al. |
| 2014/0176656 A1 | 6/2014 | Omori et al. |
| 2014/0268186 A1 | 9/2014 | Iwata et al. |
| 2014/0333940 A1 | 11/2014 | Iwata et al. |
| 2014/0333941 A1 | 11/2014 | Iwata et al. |
| 2014/0347708 A1 | 11/2014 | Omori et al. |
| 2015/0125171 A1 | 5/2015 | Iwata et al. |
| 2015/0156373 A1 | 6/2015 | Fujita et al. |

(Continued)

FOREIGN PATENT DOCUMENTS

| | | |
|---|---|---|
| JP | 2014-103319 | 6/2014 |
| JP | 2015-103680 | 6/2015 |

OTHER PUBLICATIONS

U.S. Appl. No. 15/125,422, filed Mar. 10, 2015, Muneaki Iwata, et al.

*Primary Examiner* — David M. Gray
*Assistant Examiner* — Andrew V Do
(74) *Attorney, Agent, or Firm* — Oblon, McClelland, Maier & Neustadt, L.L.P.

(57) ABSTRACT

A light source control device, includes circuitry to: apply a threshold current, a first emission current, and a first correction current to a light source to drive the light source to emit light to form a first pixel, and apply the threshold current, a second emission current, and a second correction current to the light source to drive the light source to emit light to form a second pixel, wherein the circuitry calculates a value of the second correction current by multiplying a value of the first correction current by a ratio of a value of the second emission current to a value of the first emission current, the value of the second emission current being greater than the value of the first emission current.

9 Claims, 23 Drawing Sheets

(56) References Cited

U.S. PATENT DOCUMENTS

| | | |
|---|---|---|
| 2015/0180200 A1 | 6/2015 | Fujita et al. |
| 2015/0251442 A1 | 9/2015 | Ishida et al. |
| 2015/0324671 A1 | 11/2015 | Iwata et al. |
| 2015/0350491 A1 | 12/2015 | Iwata et al. |
| 2016/0147171 A1 | 5/2016 | Ishida et al. |
| 2016/0234399 A1 | 8/2016 | Omori et al. |
| 2016/0247050 A1 | 8/2016 | Fujita et al. |
| 2017/0017177 A1 | 1/2017 | Iwata et al. |
| 2017/0286814 A1 | 10/2017 | Fujita et al. |
| 2017/0339308 A1 | 11/2017 | Fujita et al. |
| 2017/0339309 A1 | 11/2017 | Uekusa et al. |
| 2017/0343920 A1 | 11/2017 | Miyadera et al. |
| 2018/0091697 A1 | 3/2018 | Fujita |

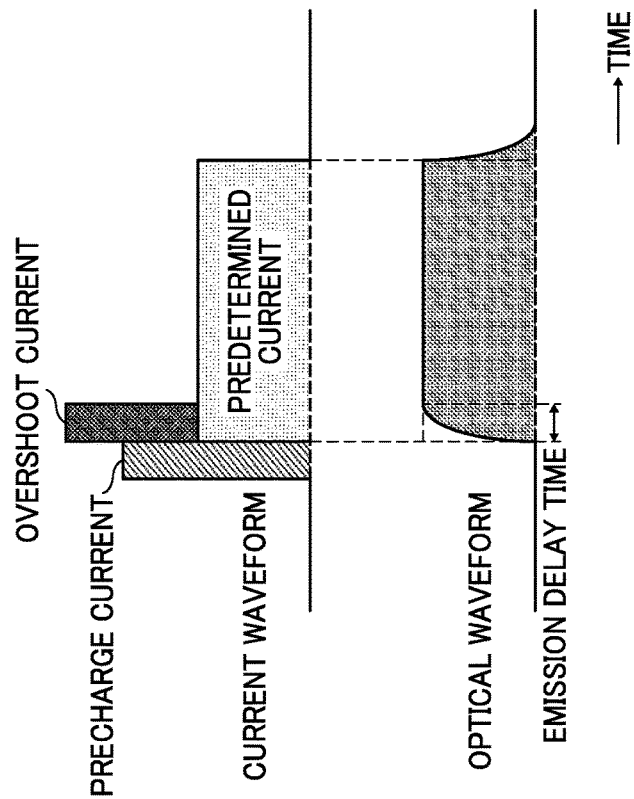
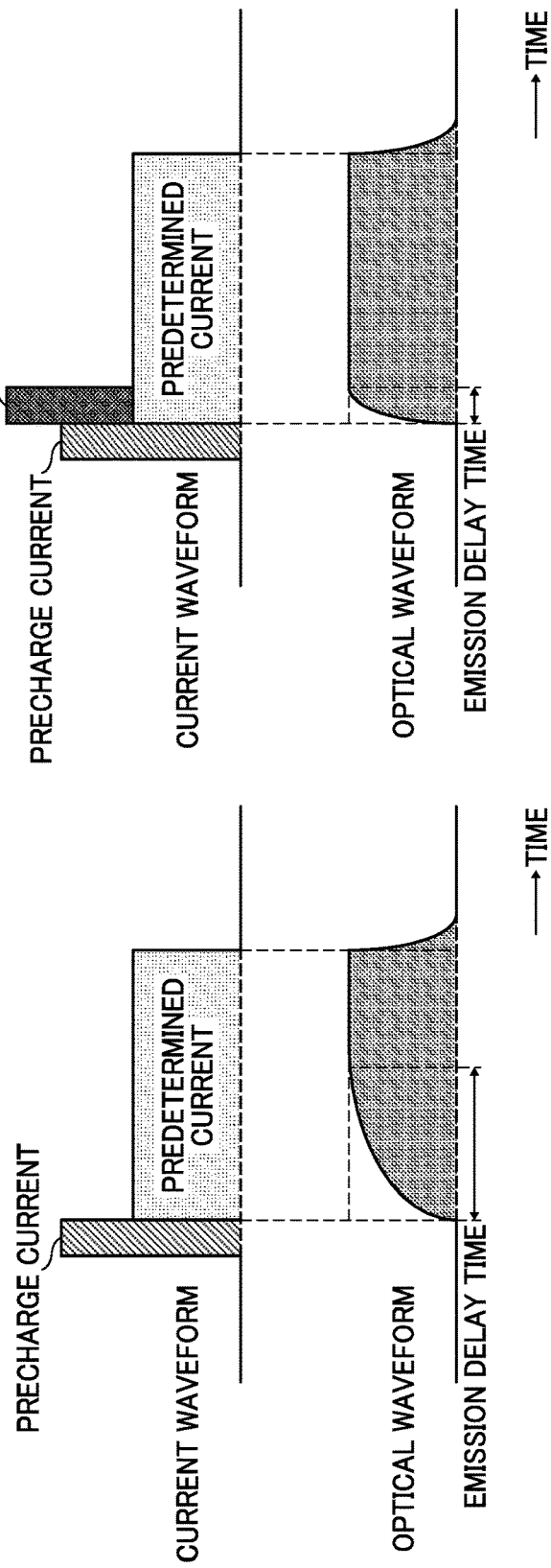
FIG. 3A
FIG. 3B

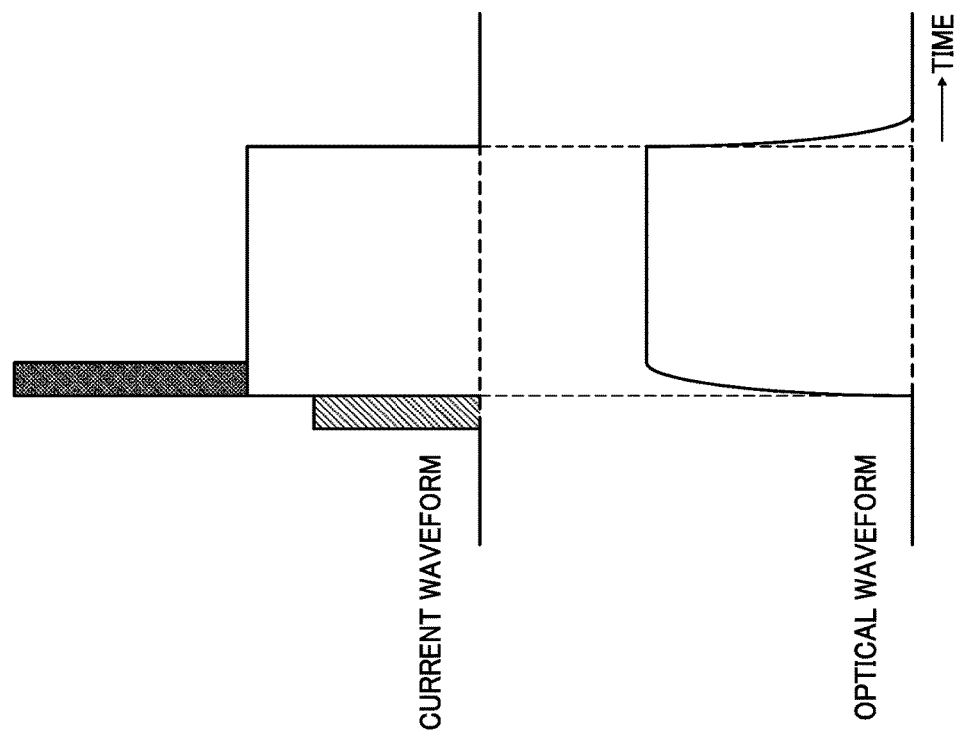
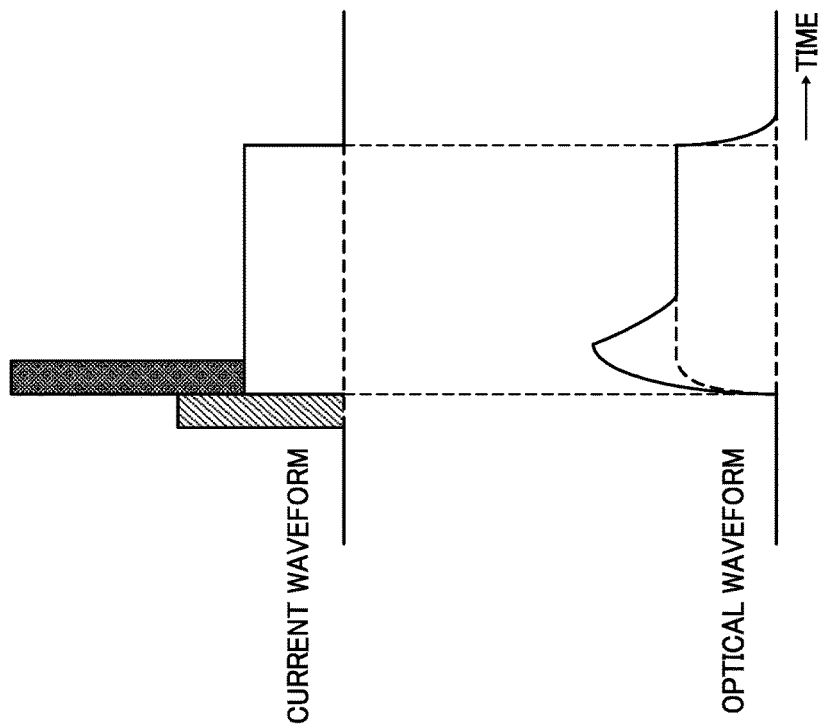

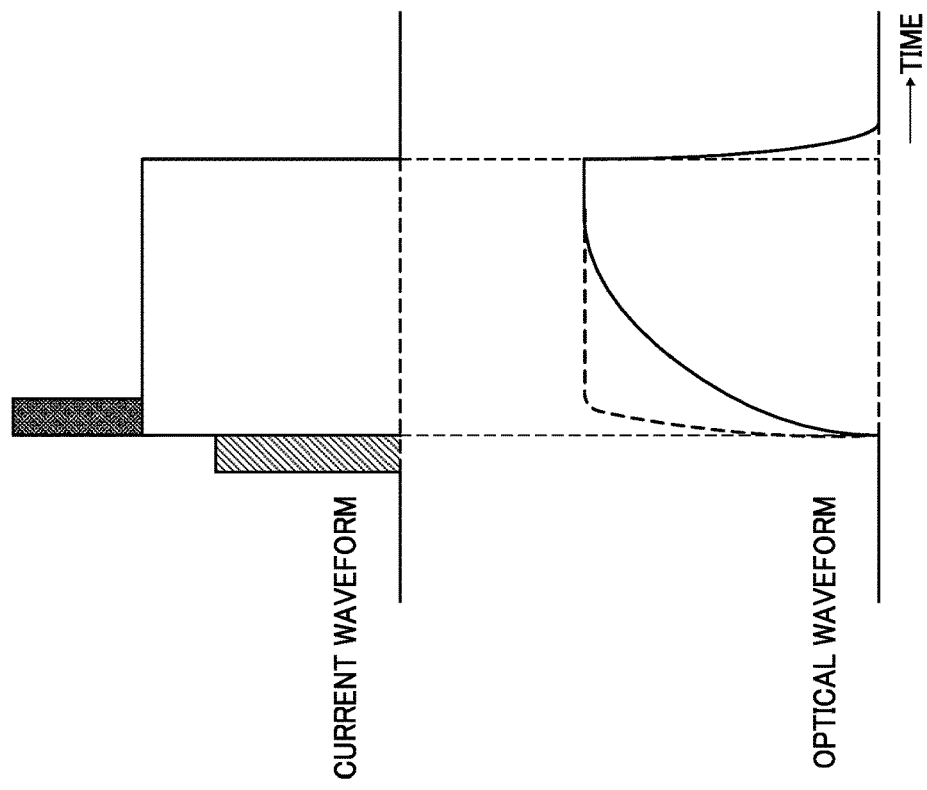
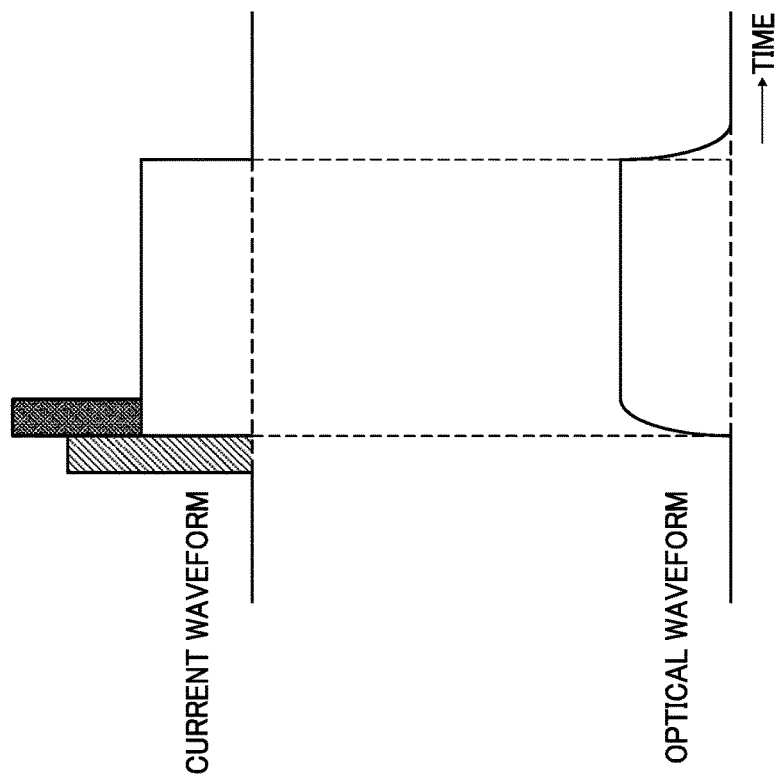

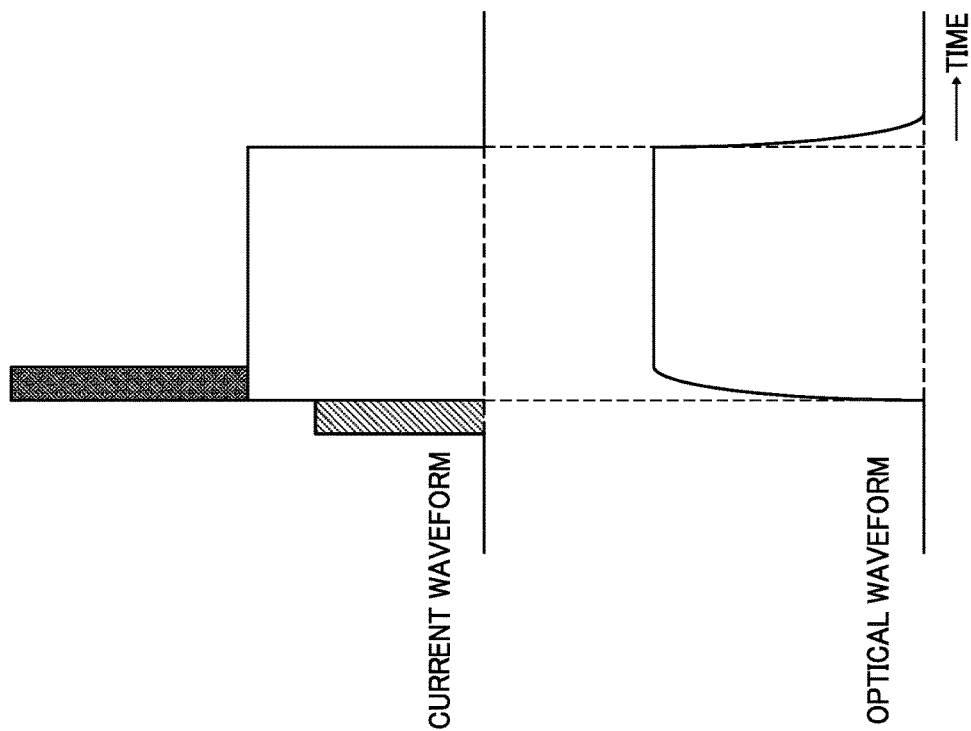
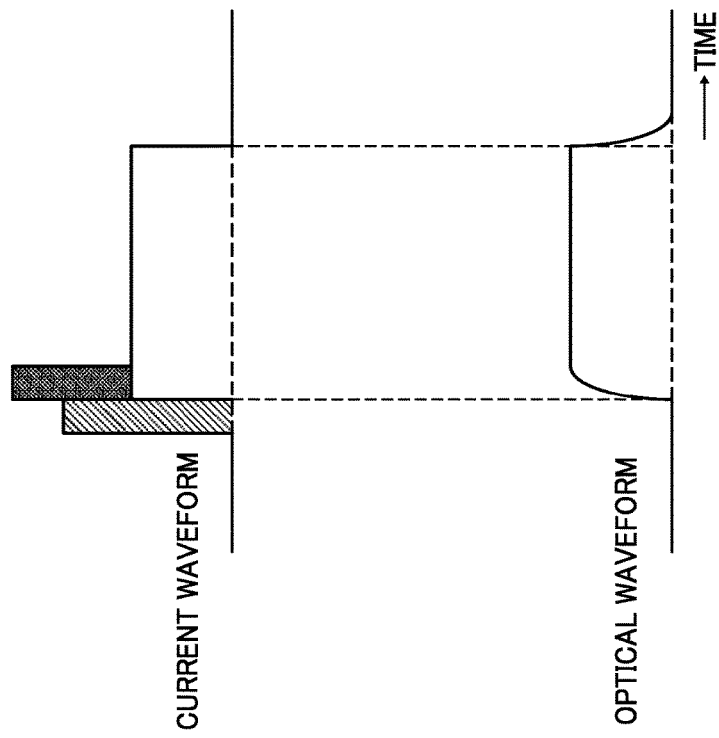

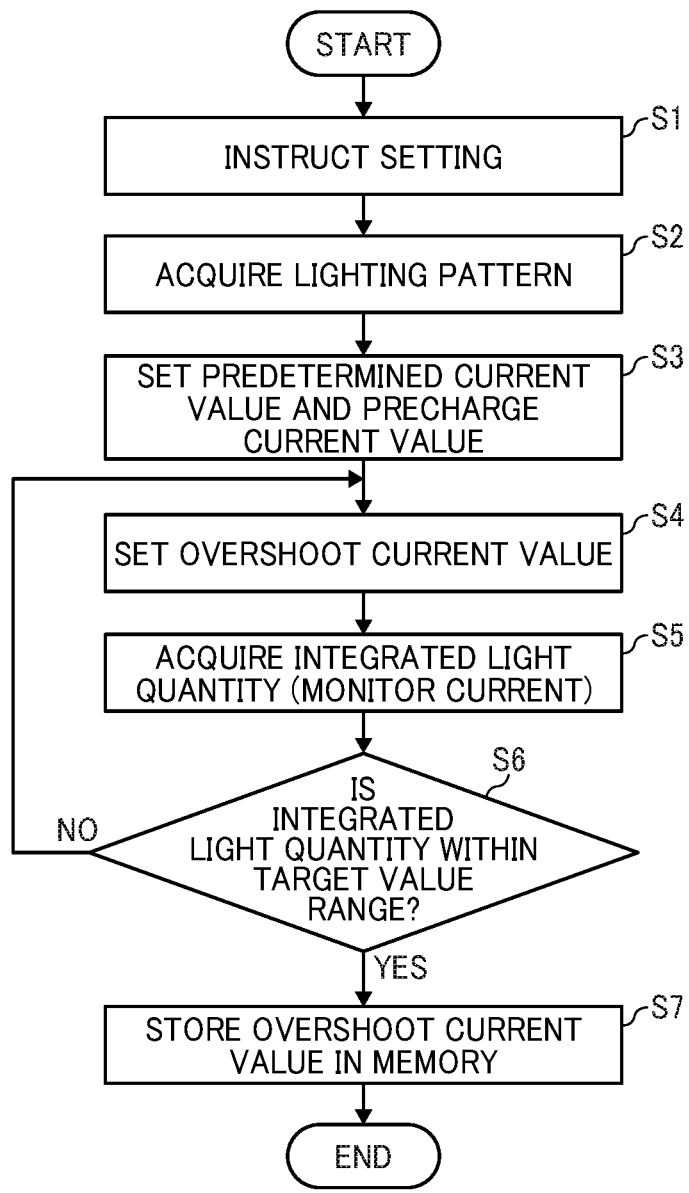

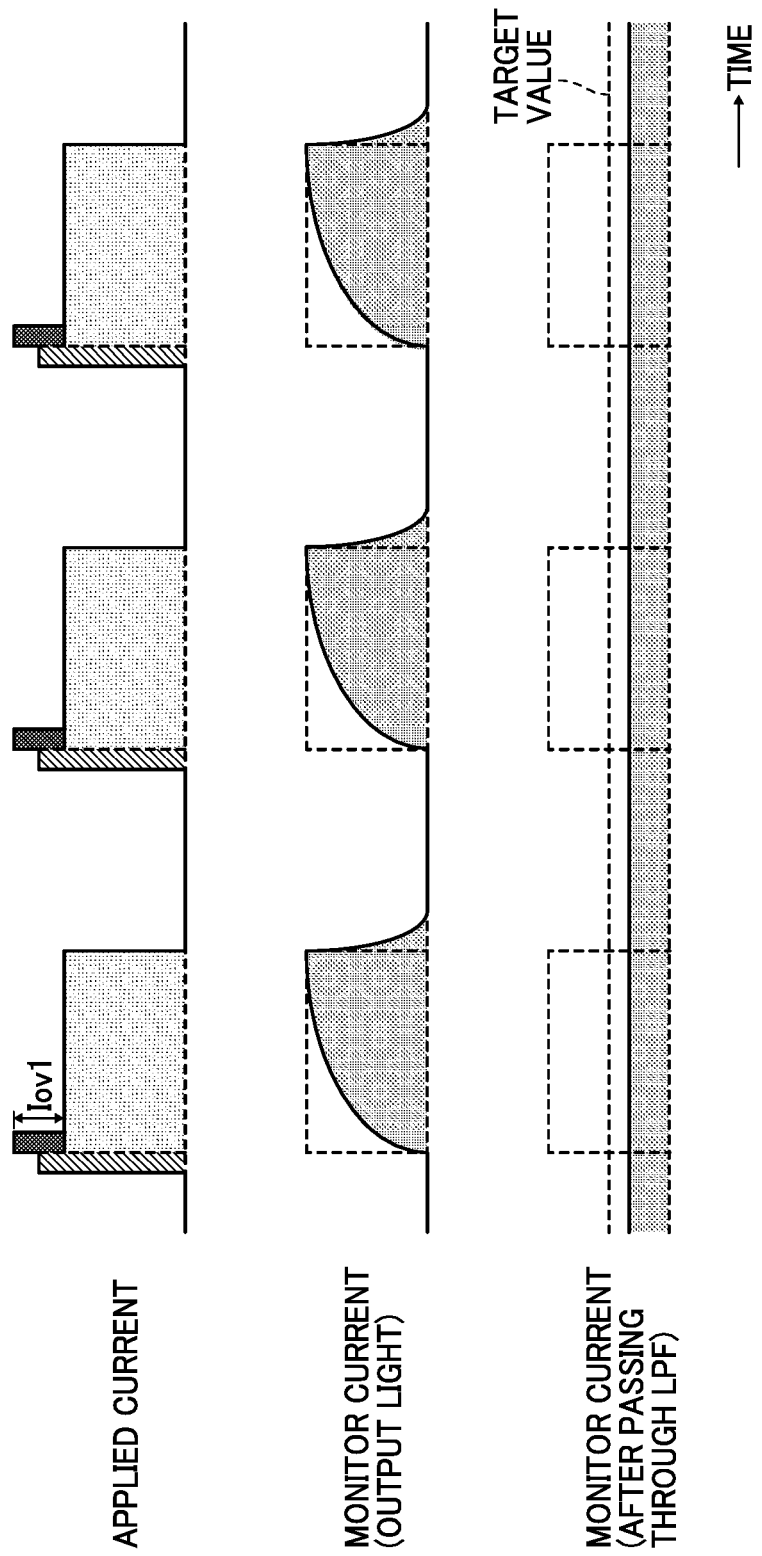

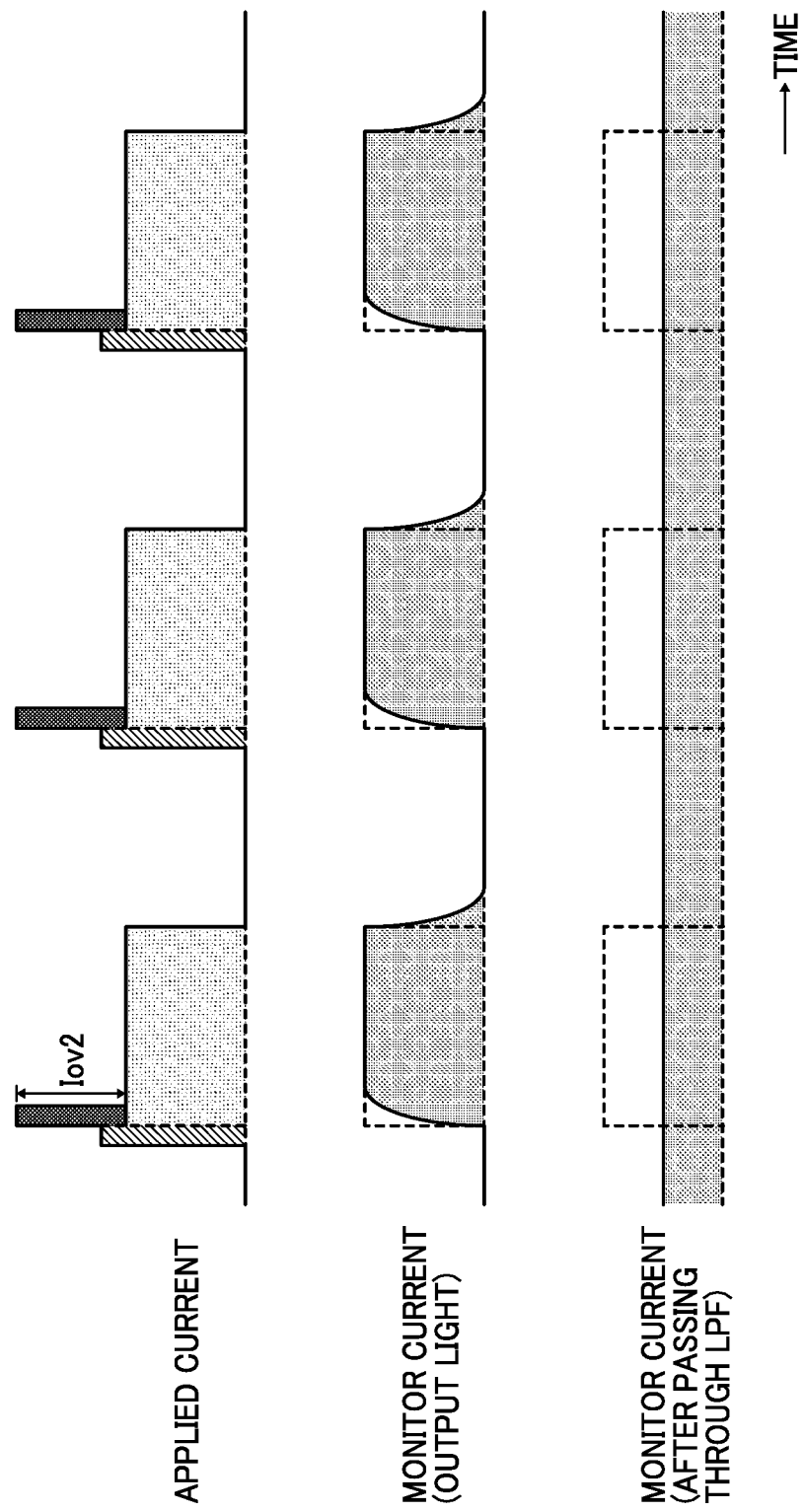

FIG. 10
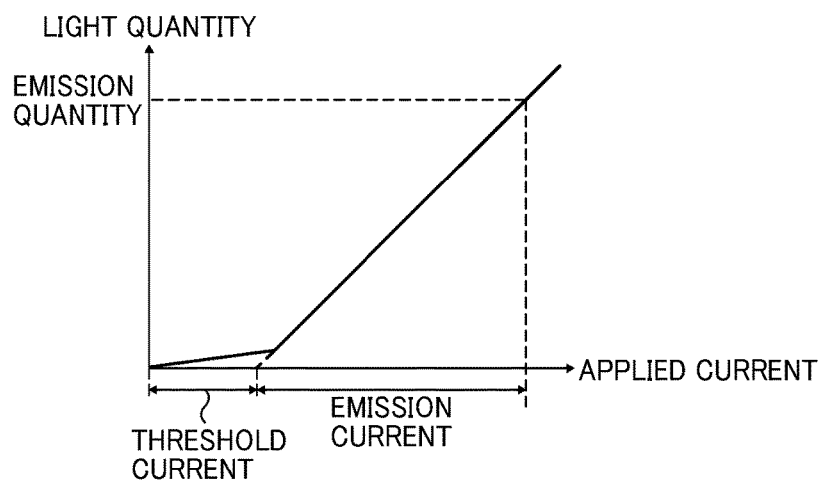
FIG. 11A
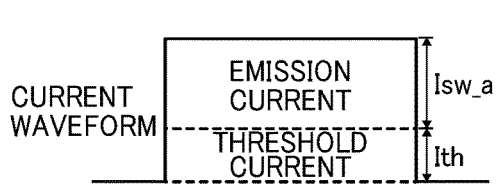
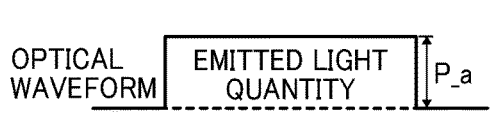
FIG. 11B
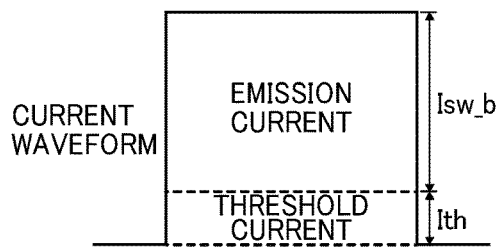
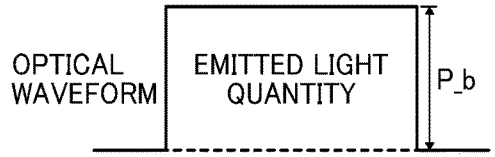

FIG. 12B
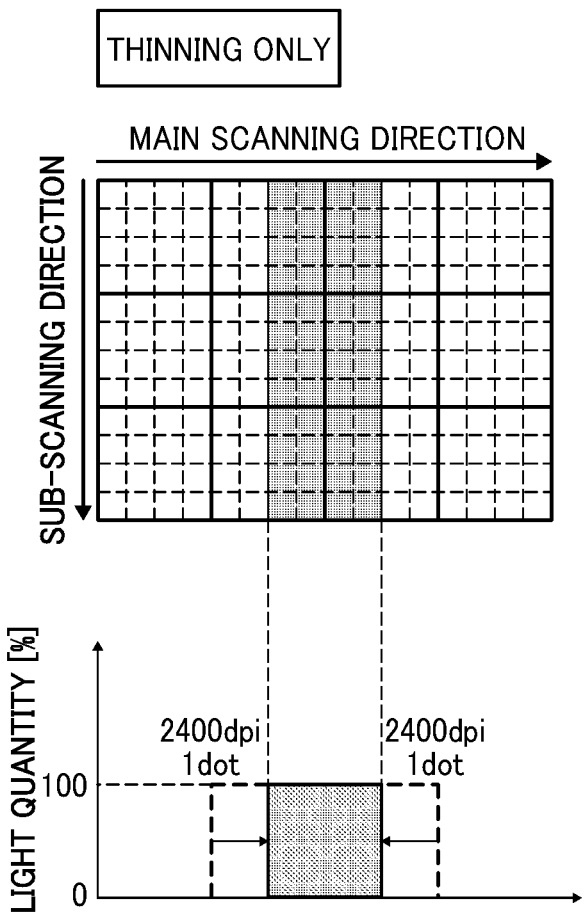
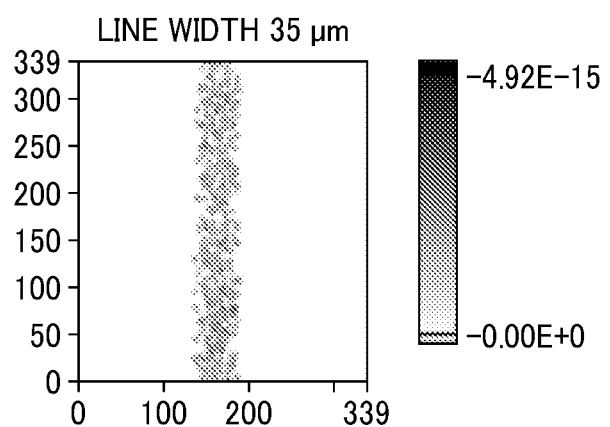

FIG. 12C
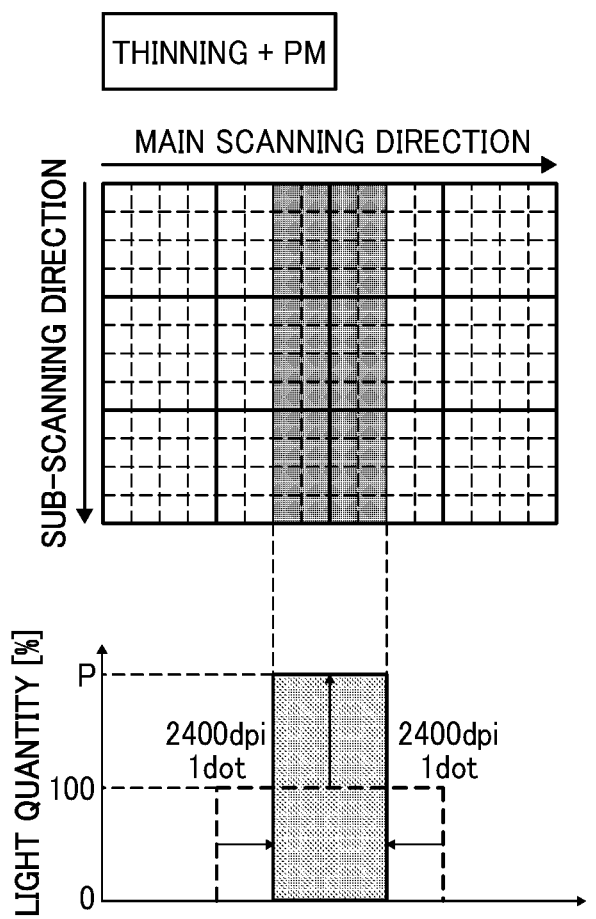
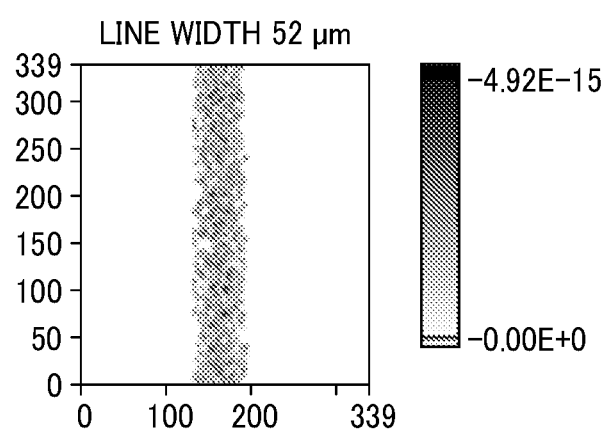

LIGHT SOURCE CONTROL DEVICE AND IMAGE FORMING APPARATUS

CROSS-REFERENCE TO RELATED APPLICATIONS

This patent application is based on and claims priority pursuant to 35 U.S.C. § 119(a) to Japanese Patent Application No. 2017-113774, filed on Jun. 8, 2017 in the Japan Patent Office, the entire disclosure of which is hereby incorporated by reference herein.

BACKGROUND

Technical Field

Aspects of the present disclosure relate to a light source control device and an image forming apparatus.

Related Art

In a digital printer using an electrophotographic process, a writing technique for exposing a specific pixel with a light having a quantity higher than an ordinary exposure light quantity is known for sharply reproducing thin lines and small-size characters. Further, a light source such as a VCSEL (Vertical Cavity Surface Emitting Laser) or the like has a large parasitic capacitance and differential resistivity. An overshoot technique is used for remedying dullness of a rising edge of an optical waveform since the optical waveform is dulled drastically in the light source such as the VCSEL.

However, the conventional method of deriving a set value of the overshoot current feed backs the light quantity output from the light source and gradually changes the overshoot current so that the integrated light quantity reaches an optimum value. Thus, it takes time to derive the optimum value of the overshoot current suitable for each light quantity when switching multiple different light quantities during printing.

SUMMARY

In an aspect of this disclosure, a light source control device includes circuitry to: apply a threshold current, a first emission current, and a first correction current to a light source to drive the light source to emit light to form a first pixel, the first correction current correcting the first emission current during application of the first emission current to the light source and apply the threshold current, a second emission current, and a second correction current to the light source to drive the light source to emit light to form a second pixel, the second correction current correcting the second emission current during application of the second emission current to the light source, wherein the circuitry calculates a value of the second correction current by multiplying a value of the first correction current by a ratio of a value of the second emission current to a value of the first emission current, the value of the second emission current being greater than the value of the first emission current.

In another aspect of this disclosure, a method of controlling a light source, the method includes: applying a threshold current, a first emission current, and a first correction current to a light source to drive the light source to emit light to form a first pixel, the first correction current correcting the first emission current during application of the first emission current to the light source and applying the threshold current, a second emission current, and a second correction current to the light source to drive the light source to emit light to form a second pixel, the second correction current correcting the second emission current during application of the second emission current to the light source, wherein the second correction current has a value calculated by multiplying a value of the first correction current by a ratio of a value of the second emission current to a value of the first emission current, the value of the second emission current being greater than the value of the first emission current.

BRIEF DESCRIPTION OF THE DRAWINGS

The aforementioned and other aspects, features, and advantages of the present disclosure will be better understood by reference to the following detailed description when considered in connection with the accompanying drawings, wherein:

FIGS. 3A and 3B are charts of the optical waveform illustrating an optical-waveform correction technique;

FIGS. 4A and 4B are graphs of the optical waveform illustrating a problem of a fixed value of an overshoot current;

FIGS. 5A and 5B are graphs of the optical waveform illustrating a problem of the fixed value of the overshoot current;

FIGS. 6A and 6B are graphs of the optical waveform illustrating a problem of the fixed value of the overshoot current;

FIG. 7 is a flowchart illustrating an example of an adjustment process of an overshoot current value;

FIG. 8 is a graph of the optical waveform illustrating an example of the adjustment process of the overshoot current;

FIG. 9 is a graph of the optical waveform illustrating an example of the adjustment process of the overshoot current;

FIG. 10 is a graph illustrating an I-L characteristics and current configuration of the LD;

FIGS. 11A and 11B are diagrams illustrating the I-L characteristic and current configuration of the LD;

FIGS. 12A through 12C are diagrams illustrating an example of a power modulation technique;

Figure 1:
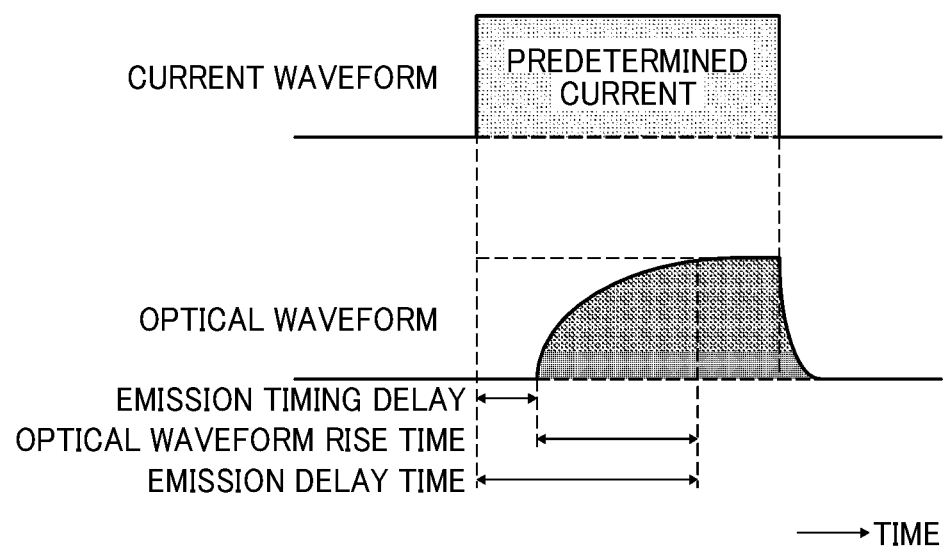
FIG. 1 is a diagram illustrating a rising delay of an optical waveform.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in an analogous manner, and achieve similar results.

Although the embodiments are described with technical limitations with reference to the attached drawings, such description is not intended to limit the scope of the disclosure and all the components or elements described in the embodiments of this disclosure are not necessarily indispensable. As used herein, the singular forms "a", "an", and "the" are intended to include the plural forms as well, unless the context clearly indicates otherwise.

Embodiments of the present disclosure are described with reference to the accompanying drawings.

FIG. 1 is a diagram illustrating a rising delay of an optical waveform. FIG. 1 illustrates a waveform of a drive current (current waveform) supplied to the light source and a waveform of a light output (optical waveform) of the light source during driving the light source. When the current waveform is a simple square wave, a delay occurs during a start of supplying the drive current to the light source until an output of light quantity by the light source reaches a predetermined light quantity (target light quantity). The delay time is referred to as "emission delay time".

As illustrated in FIG. 1, the emission delay time is composed of two elements. A first element is an emission timing delay, which is time from the start of supplying the drive current to the light source until the light source starts lighting. A second element is the rise time of the optical waveform (optical waveform rise time), which is the time from a start of lighting until the light quantity reaches to the target light quantity.

The emission timing delay is a charging time to a parasitic capacitance (described in detail below in FIG. 2) occurring in parallel to a light source existing in wiring for connecting the light source and a circuit or wiring in a package of the light source or the like. Since the charge time increases as the parasitic capacitance increases, the emission delay time also increases.

The optical waveform rise time depends on characteristics of the light source. For example, the rise time of the optical waveform is affected by the differential resistivity of the light source. Since it is difficult to send current to the light source as the differential resistivity increases, the rise time of the optical waveform also increases.

Figure 2:
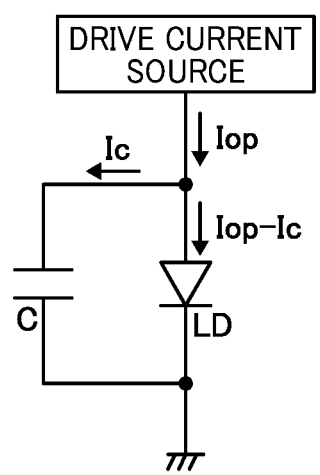
FIG. 2 is a circuit diagram illustrating a parasitic capacitance.

FIG. 2 is a circuit diagram illustrating a parasitic capacitance C, which includes a parasitic capacitance generated in the wiring that connects a laser diode (LD) and a laser diode driver (LD driver) or the like when the LD is mounted on a circuit board or the like together with a circuit such as the LD driver. Further, the parasitic capacitance C also includes a parasitic capacitance of a package or the like when the circuit such as the LD or the LD driver is packaged When a predetermined current Iop is supplied to the LD from a drive current source, a current Ic that is a part of the predetermined current Iop is supplied to the parasitic capacitance C to charge the parasitic capacitance C.

While the parasitic capacitance C is charged by the current Ic, a current (Iop−Ic) which is a part of the predetermined current Iop is supplied to the LD. When charging of the parasitic capacitance C is completed, the predetermined current Iop is supplied to the LD.

In other words, the charge time of the parasitic capacitance C by the current Ic becomes a time during which the light output cannot be obtained because only the current (Iop−Ic) that is a part of the predetermined current Iop is supplied to the LD. The time during which the light output cannot be obtained is the emission delay time.

The following description pertains to a correction technique for correcting an emission timing delay or the dullness in a rise of the optical waveform as illustrated in FIG. 1.

FIGS. 3A and 3B are graphs of the optical waveform illustrating an optical-waveform correction technique. Comparing FIG. 3A with FIG. 1, the emission timing delay is shortened in FIG. 3A by applying a current for charging the parasitic capacitance before supplying the predetermined current Iop to the LD. This current is referred to as a precharge current. As illustrated in FIG. 3A, the emission delay time can be reduced since the parasitic capacitance is charged with the precharge current before the application of the predetermined current Iop to the LD. Generally, a fixed value is used for the precharge current and an application period of the precharge current.

Comparing FIG. 3B with FIG. 3A, the optical waveform rise time can be shortened in FIG. 3B by applying a current to which an auxiliary current is added to the predetermined current Iop in synchronized with the predetermined current Iop. This current is called an overshoot current. Generally, a fixed value is used for an application time of the overshoot current illustrated in FIG. 3B. However, the value of the current has to be adjusted according to a magnitude of the predetermined current Iop.

FIGS. 4A and 4B are graphs of the optical waveform illustrating a problem of the fixed value of the overshoot current. Originally, the overshoot current has to be adjusted according to the magnitude of the predetermined current Iop and the light quantity. FIGS. 4A and 4B illustrate an influence of using the fixed value of the overshoot current regardless of the magnitude of the predetermined current and the output light quantity. FIG. 4A illustrates a case in which the predetermined current and light quantity are small. FIG. 4B illustrates a case in which the predetermined current and light quantity are large.

FIGS. 4A and 4B illustrate an optical waveform in a case in which the overshoot current that is optimum with a large predetermined current is applied to each predetermined current. Since the overshoot current is optimized for the large predetermined current, the dullness of the rising waveform is remedied in the optical waveform (large light quantity) in FIG. 4B. However, the optical waveform (small light quantity) in FIG. 4A suffers an excessive rise correction. Thus, the optical waveform in FIG. 4A greatly exceeds the target light quantity, and the LD emits light excessively (excessive light emission). If the excessive light emission occurs, an amount of toner adhered to a photoconductor varies, and unevenness of density in the image may occur.

FIGS. 5A and 5B are graphs of the optical waveform illustrating a problem of the fixed value of the overshoot current. FIGS. 5A and 5B illustrate an optical waveform in a case in which the overshoot current that is optimum with a small predetermined current is applied to each predetermined current. Since the overshoot current is optimized for the small predetermined current, the dullness of the rising waveform is remedied in the optical waveform (small light quantity) in FIG. 5A without occurrence of the excessive light emission comparing to the optical waveform in FIG. 4A.

However, with respect to the optical waveform (large light quantity) in FIG. 5B, the correction by the overshoot current is insufficient so that the dullness of the rising waveform is insufficiently remedied. At this time, since an integrated light quantity (the area of the optical waveform illustrated in FIG. 5B) is insufficient, an amount of toner adhered to a photoconductor becomes insufficient which may lead to blurring of the image.

FIGS. 6A and 6B are graphs of the optical waveform illustrating another problem of the fixed value of the overshoot current. In FIG. 6, the overshoot current is adjusted according to the magnitude of the predetermined current and the light quantity. As illustrated in FIG. 6A, when the light quantity is small, the overshoot current is small. As illustrated in FIG. 6B, when the light quantity is large, the overshoot current is large so that a desired optical waveform can be obtained in either case of the small light quantity and the large light quantity.

FIG. 7 is a flowchart illustrating an example of an adjustment process of an overshoot current value. In FIG. 7, a circuit for supplying a current to the light source is referred to as "a light-source driving circuit" (see FIG. 14).

In step S1, upon receiving an instruction to set the overshoot current value, the light-source driving circuit 1040 starts setting each current value such as the overshoot current value, the precharge current value, and the predetermined current value in the LD as a setting target of each current value. Next, the light-source driving circuit 1040 acquires a lighting pattern for adjusting the overshoot current value from the memory or the like (step S2). The lighting pattern is, for example, a repetition of one ON pixel and one OFF pixel.

Next, the light-source driving circuit 1040 acquires the predetermined current value to be applied to the LD for outputting the light quantity for exposing a normal pixel by the LD and sets the acquired predetermined current value to the LD. Then, the light-source driving circuit 1040 acquires the precharge current value for improving the emission timing delay from the memory or the like and sets the acquired precharge current value in the LD (step S3). The adjustment process of the overshoot current value is started after the steps S1 through S3 are performed as a preparatory step.

First, the light-source driving circuit 1040 acquires the overshoot current value for initial setting from the memory or the like and sets the overshoot current value in the LD (step S4). The light-source driving circuit 1040 applies the predetermined current, the precharge current, and the overshoot current to the LD with the obtained lighting pattern and each current value and causes the LD to emit light. The light emitted from the LD is received by a photodetector (PD). The light-source driving circuit 1040 removes a frequency component by passing the monitoring current by the PD through a low-pass filter (LPF) (step S5) and acquires an integrated light quantity.

The light-source driving circuit 1040 determines whether or not the integrated light quantity is within a target value range (step S6). If the integrated light quantity is outside the target value range (NO in step S6), the process returns to step S4. The light-source driving circuit 1040 changes the overshoot current value and applied the overshoot current to the LD again. In step S4, the light-source driving circuit 1040 sets a value larger than an immediately preceding current value as the overshoot current value when the integrated light quantity is lower than the target value.

Conversely, when the integrated light quantity is higher than the target value, the light-source driving circuit 1040 sets a value smaller than an immediately preceding current value as the overshoot current value. When the integrated light quantity eventually enters the target value range after repeating the steps S4 through S6 (YES in step S6), the light-source driving circuit 1040 stores the overshoot current value in the memory (step S7) as a set value for actually use. Then, the adjustment process of the overshoot current value is completed. Note that a fixed value may be set for the precharge current value regardless of the integrated light quantity.

FIG. 8 is a graph of the optical waveform illustrating an example of the adjustment process of the overshoot current. FIG. 8 illustrates the application current, the optical waveform, and the integral light quantity when the adjustment process of the overshoot current value in FIG. 7 is performed.

FIG. 8 illustrates a state in which an integral light quantity is insufficient with a target value in step S6 of the flowchart in FIG. 7. In FIG. 8, the dullness of the optical waveform is not remedied since the correction by the overshoot current (Iov 1) is insufficient (see monitor current (output light) in FIG. 8). Thus, the monitor current is insufficient for the target value after passing through the LPF since the integral light quantity is insufficient to compensate the dullness of the optical waveform.

FIG. 9 is a graph of the optical waveform illustrating an example of the adjustment process of the overshoot current. FIG. 9 illustrates a state in which the integral light quantity is substantially equal to the target value in the step S6 of the flowchart in FIG. 7. This state corresponds to a result of the adjustment process that is performed by increasing the overshoot current from the state in which the integral light quantity is insufficient (see FIG. 8) to the state in which the integral light quantity is substantially equal to the target value. As a result of the increased overshoot current (Iov 2), the rise of the optical waveform improves, and the integrated light quantity increases. Further, the monitor current after passing through the LPF has reached the target value.

FIG. 10 is a graph illustrating an I-L characteristic (Injection current-Light output characteristics) and current configuration of the LD. FIG. 10 is a graph of I-L characteristics of LD. Generally, when the application current is smaller than the predetermined threshold value, the light output of the LD is extremely small. Laser oscillation is started at a certain point (change point) as the application current is increased, and the light output abruptly increases. The change point is also referred to as an oscillation threshold current. As illustrated in FIG. 10, an emission current and the light output are proportional in general laser oscillation.

Therefore, a magnification of the light quantity can be changed by simply changing the emission current.

FIGS. 11A and 11B are diagrams illustrating the I-L characteristic and current configuration of the LD, that is, an image of the predetermined current when the light quantity is magnified. To magnify the light quantity from a light quantity P_a illustrated FIG. 11A to a light quantity P_b illustrated in FIG. 11B, a magnification ratio (P_b/P_a) of the light quantity is integrated to the emission current Isw_a. FIG. 11A illustrates a reference for a magnification process in which a light quantity as a reference (reference light quantity) is P_a and the emission current is Isw_a. Therefore, Equation of P_b/P_a=Isw_b/Isw_a holds. Here, Ith is a threshold current.

Figure 12A:
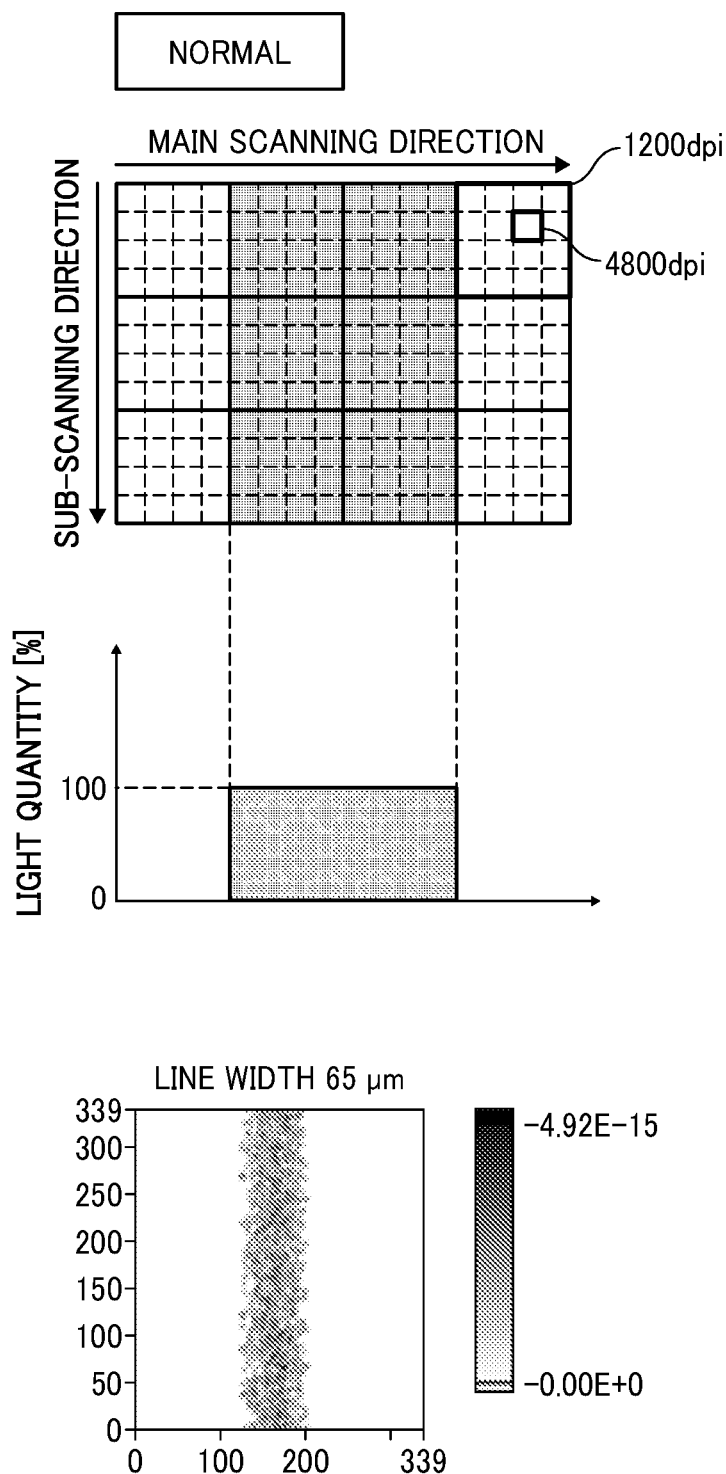

FIGS. 12A through 12C are diagrams illustrating an example of a power modulation technique. FIGS. 12A through 12C illustrate an example of a technique that simultaneously use the reference light quantity P_a based on the emission quantity and the magnified light quantity P_b as illustrated in FIGS. 11A and 11B.

In the electrophotographic process, blurring may occur when thin lines are formed. In a "normal" image forming process illustrated in FIG. 12A, light is emitted with a line width of about 42 µm corresponding to two pixels at 1200 dpi. A line formed by the image forming process is greatly thickened to have a line width of about 65 µm. In the image forming process of "thinning only" as illustrated in FIG. 12B, light is not emitted for one pixel at 2400 dpi at both ends of the line widths without changing the light quantity as described in "normal" in FIG. 12A. A line width formed by "thinning only" is about 35 µm and image blur occurs. Thus, in the image forming process of "thinning+PM (power modulation)" as illustrated in FIG. 12, the light is emitted with a light quantity of "only thinning" increased to P times. A line width formed by "thinning+PM" is about 52 ums, and an occurrence of the image blur is suppressed. As described above, the emitted light quantity is increased (power modulated) for a pixel that forms a thin line.

Figure 13:
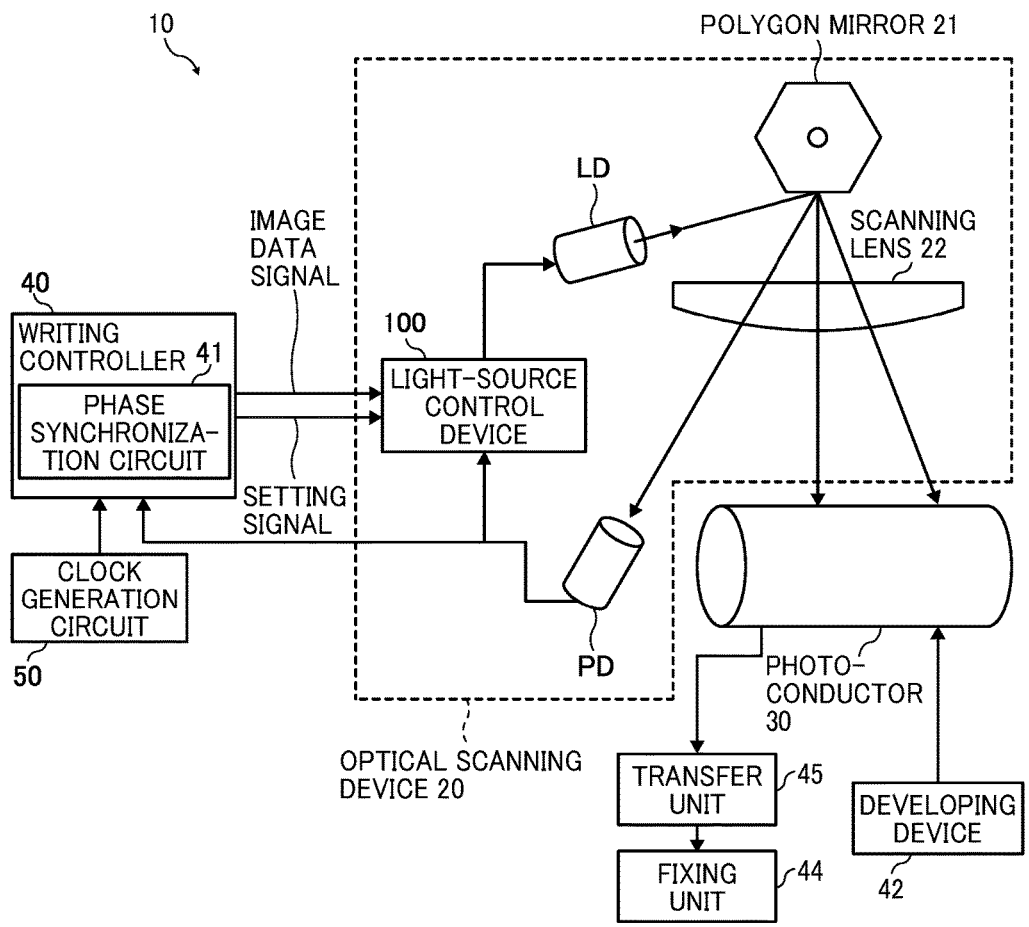
FIG. 13 is a circuit diagram illustrating a configuration of an image forming apparatus according to the first embodiment.

FIG. 13 is a circuit diagram illustrating a configuration of the image forming apparatus 10 according to the first embodiment. As illustrated in FIG. 13, the image forming apparatus 10 includes an optical scanning device 20, a photoconductor 30, a writing controller 40, and a clock generation circuit 50. The writing controller 40 includes a phase synchronization circuit 41.

The optical scanning device 20 includes a polygon mirror 21, a scanning lens 22, a light-source control device 100, a laser diode (LD) as a light emitting element (light source), and a photo diode (PD) as a light receiving element. In the present embodiment, the laser diode (LD) is used as the light source. However, the light source of the present disclosure is not limited to the LD. For example, the light source may be a semiconductor laser array (LDA, Laser Diode Array), a VCSEL (Vertical Cavity Surface Emitting Laser), or the like. Further, the light-source control device 100 may include LD and the PD.

The laser light emitted from the LD is scanned by the rotating polygon mirror 21 and irradiated onto a photoconductor 30 via the scanning lens 22. The photoconductor 30 is a medium to be scanned by the laser light. The irradiated laser light becomes a light spot on the photoconductor 30. An electrostatic latent image is formed on the photoconductor 30 by the light spot. Further, the polygon mirror 21 irradiates the PD with the laser light every time the polygon mirror 21 completes scanning of one line. When the laser light is irradiated onto the PD, the PD converts the laser light into an electric signal, and inputs the electric signal to a phase synchronization circuit 41. When the electric signal is input, the phase synchronization circuit 41 generates a pixel clock for the next one line. Further, a high frequency clock signal is inputted to the phase synchronization circuit 41 from a clock generation circuit 50. A phase of the pixel clock is synchronized by the clock signal. The electric signal from the PD is also input to the light-source control device 100.

The writing controller 40 supplies an image data signal including a reference pulse signal to the light-source control device 100 according to the generated pixel clock. Further, the writing controller 40 supplies a setting signal for controlling the power modulation to the light-source control device 100 to drive the LD. With these signals (image data signal, reference pulse signal, and setting signal), the light-source control device 100 drives the LD and forms an electrostatic latent image of the image data on the photoconductor 30.

The image forming apparatus 10 includes a developing device 42 that supplies toner to the photoconductor 30 on which the electrostatic latent image has been written to develop the latent image into a visible toner image. The photoconductor 30 serves as an image bearing member. The image forming apparatus 10 further includes a transfer unit 43 and a fixing unit 44. The transfer unit 43 electrically transfers the visualized toner image to a recording sheet as a recording medium. The fixing unit 44 fixes the toner image to the recording medium by heat and pressure.

Figure 14:
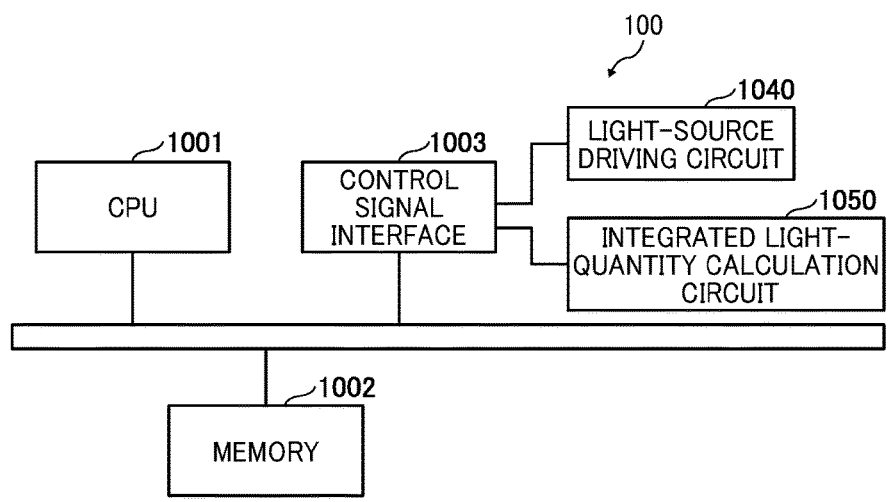
FIG. 14 is a block diagram of an example of a hardware configuration of a light-source controller according to the first embodiment.

FIG. 14 is a block diagram of an example of a hardware configuration of the light-source control device 100 according to the first embodiment. As illustrated in FIG. 14, the light-source control device 100 includes a CPU (Central Processing Unit) 1001, a memory 1002, and a control signal interface 1003, a light-source driving circuit 1040, and integrated light-quantity calculation circuit 1050. The CPU 1001, the memory 1002, and the control signal interface 1003 are electrically connected to each other.

A program for executing the process in the light-source control device 100 is stored in the memory 1002. The memory 1002 stores the installed programs and stores necessary files, data, and the like. The memory 1002 is any one of SRAM (Static Random Access Memory), DDR (Double Data Rate)—SDRAM (Synchronous Dynamic Random Access Memory), ROM (Read Only Memory), a memory card such as a flash memory or an external storage medium, or may include a plurality of memories as described above.

As illustrated in FIG. 14, the control signal interface 1003 is an input/output interface that connects the light-source driving circuit 1040 and the integrated light-quantity calculation circuit 1050 via control signals. The control signal interface 1003 also inputs signals from and outputs signals to outside of the light-source control device 100. The control signal interface 1003 may be an interface such as a general purpose input/output port, a serial port, or the like built in the CPU 1001.

Figure 15:
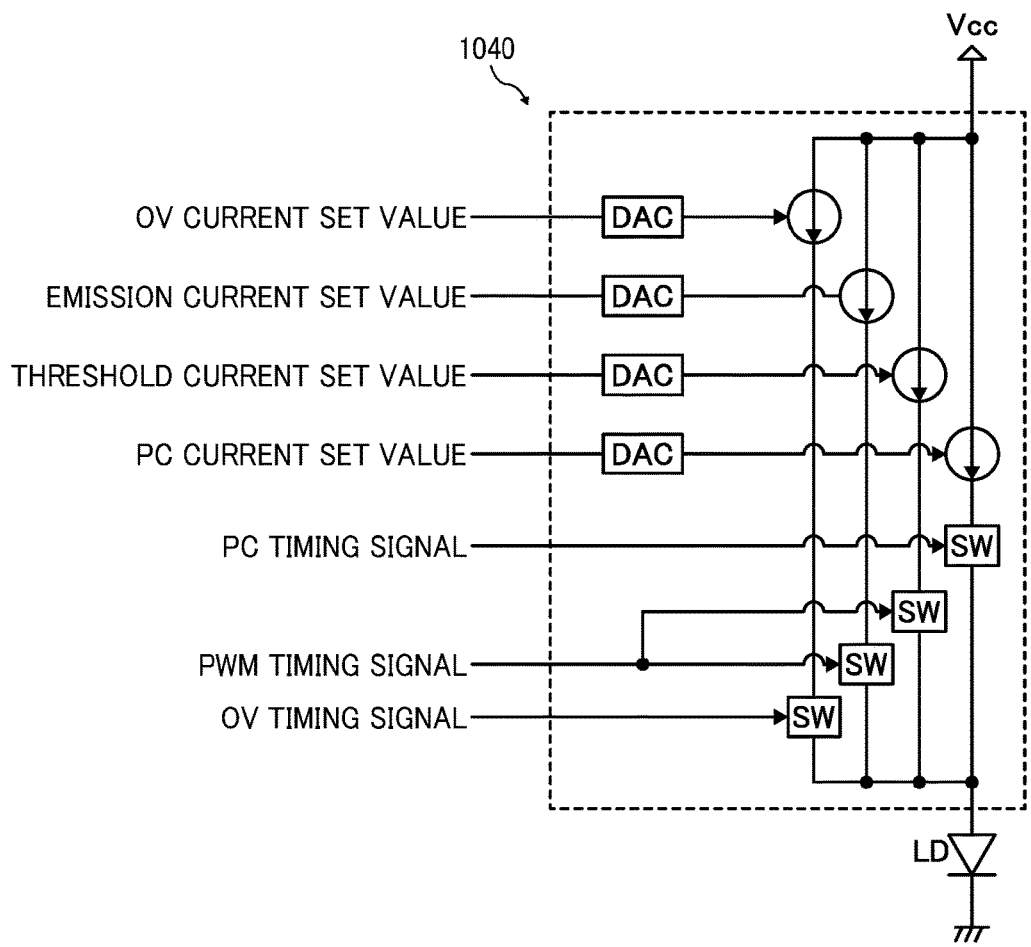
FIG. 15 is a circuit diagram of an example of a hardware configuration of a light-source driving circuit in the first embodiment.

FIG. 15 is a circuit diagram of an example of a hardware configuration of the light-source driving circuit 1040 in the first embodiment. The light-source driving circuit 1040 receives a light-source modulation pulse signal and a light-source application current data and drives the light source (LD). The light-source modulation pulse signal includes "PC timing signal", "PWM (pulse width modulation) timing signal", and "OV timing signal". The light-source application current data includes "OV current set value", "emission current set value", "threshold current set value", and "PC current set value".

As illustrated in FIG. 15, the light-source driving circuit 1040 includes a plurality of current sources, a DAC (Digital to Analog Converter), and a switch SW. The plurality of current sources generates a current in the forward direction of the LD to be supplied to the LD as the light source. The DAC is used for input for controlling a current value of the current source. The plurality of current sources includes a current source for the overshoot current (overshoot current source), a current source for the emission current (emission current source), a current source for the threshold current (threshold current source), and a current source for the precharge current (precharge current source). Each current source has a configuration in which a current setting value digitally corresponding by the DAC is settable. The "OV current set value" is set for the overshoot current source. The "emission current set value" is set for the emission current source. The "threshold current set value" is set for the emission current source. The "PC current set value" is set for the precharge current source.

Further, as illustrated in FIG. 15, control of a light emission with a desired lighting pattern is enabled by turning on or turning off the current sources by the switch SW according to each timing signals. The "PC timing signal" is a signal for switching the timing of the application of the precharge current. The "PWM timing signal" is a signal to be switched at the timing of application of the light emission current and the threshold current. "OV timing signal" is a signal to be switched at the timing of application of the overshoot current.

Figure 16:
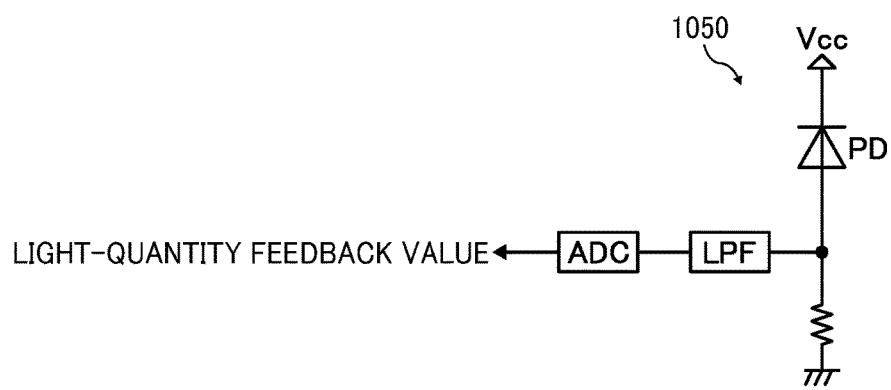
FIG. 16 is a circuit diagram of an example of a hardware configuration of an integrated light-quantity calculation circuit in the first embodiment.

FIG. 16 is a circuit diagram of an example of a hardware configuration of the integrated light-quantity calculation circuit 1050 in the first embodiment. Here, a basic method is illustrated in which a voltage is detected by sending a current through a resistor. When the PD detects the laser light from the LD, a voltage corresponding to a detected light quantity is generated. The voltage generated by the PD is averaged by way of the LPF and is converted to a digital signal by ADC (Analog to Digital Converter) and is output as a light-quantity feedback value.

Thus, the value of the first emission current and the value of the first correction current are set based on a feedback signal output from the PD 300 corresponding to light quantity of the light emitted from the light source 200.

Figure 17:
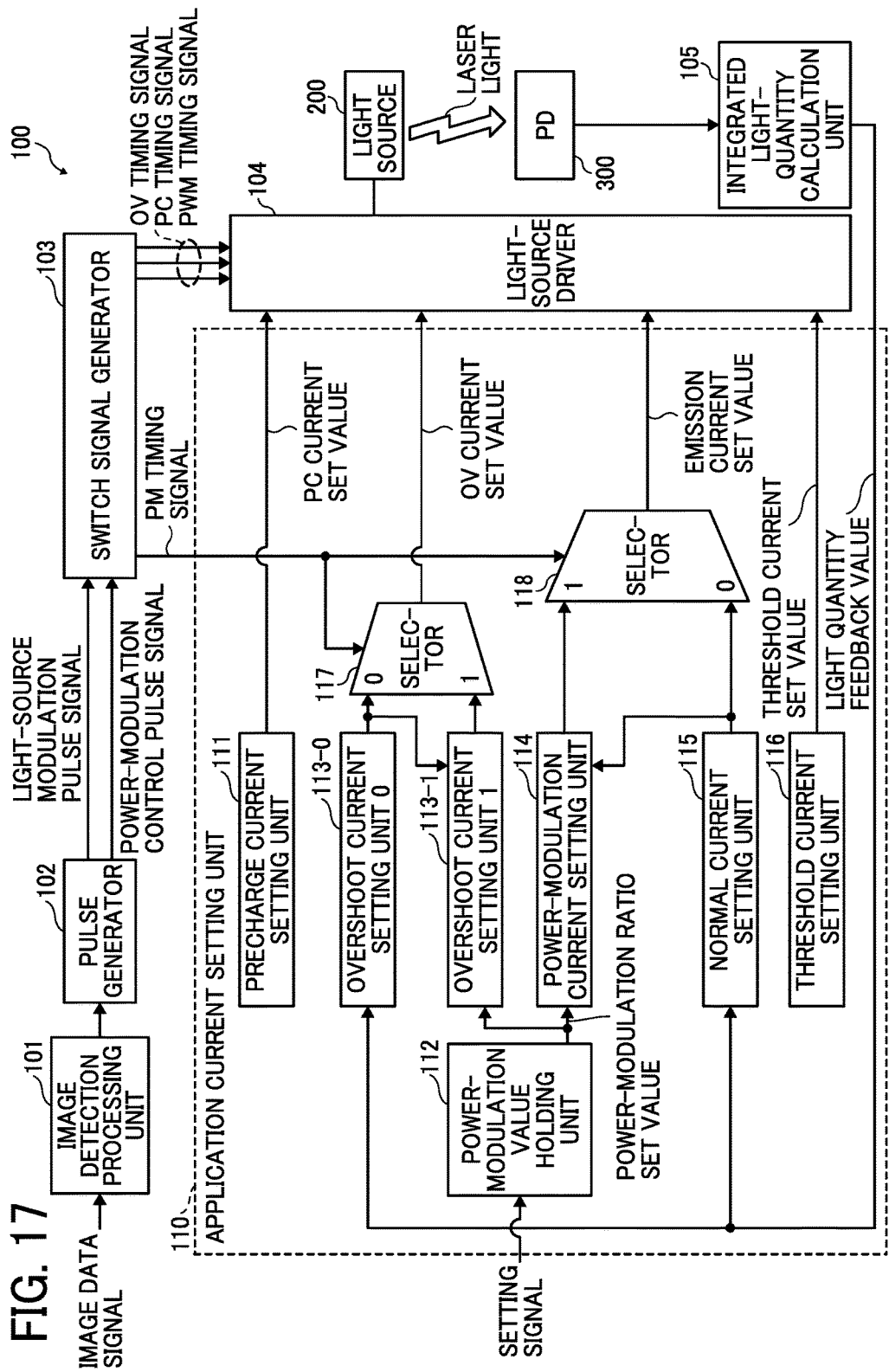
FIG. 17 is a circuit diagram of a functional configuration of the light-source control device according to the first embodiment.

FIG. 17 is a circuit diagram of a functional configuration of the light-source control device 100 according to the first embodiment. As illustrated in FIG. 17, the light-source control device 100 includes an image detection processing unit 101, a pulse generator 102, a switch signal generator 103, a light-source driver 104, an integrated light-quantity calculation unit 105, and an application current setting unit 110. The application current setting unit 110 includes a precharge current setting unit 111, a power-modulation value holding unit 112, an overshoot current setting unit 0 (113-0), an overshoot current setting unit 1 (113-1), a power-modulation current setting unit 114, a normal current setting unit 115, a threshold current setting unit 116, a selector 117, and a selector 118.

Each of the components described above is implemented by a process executed by one or more programs installed in the light-source control device 100 that causes the CPU 1001 to execute the process. Further, the light-source driver 104 may be implemented by the light-source driving circuit 1040, and the integrated light-quantity calculation unit 105 may be implemented by the integrated light-quantity calculation circuit 1050.

The image detection processing unit 101 performs a process such as pattern matching on the image data to detect whether or not a pixel of interest is a target pixel to be subjected to image processing based on an input image data signal. The image processing is, for example, high resolution, thinning, smoothing, power modulation point detection, and the like. When a pixel of interest is the target pixel, the image detection processing unit 101 executes a conversion of the pixel information and transmits the converted pixel information to the subsequent stage (pulse generator 102). Further, when the target pixel is detected as a power modulation target pixel, the image detection processing unit 101 also adds light quantity data to the converted pixel information and transmits to the pulse generator 102.

The pulse generator 102 acquires the image data and the light quantity data after the image processing from the image detection processing unit 101 and generates a light-source modulation pulse signal and a power-modulation control pulse signal from the acquired image data and the light quantity data. The light-source modulation pulse signal is a signal serving as a reference for controlling timing of turning on and turning off the light source 200 (LD). The power-modulation control pulse signal is a signal serving as a reference for controlling the timing of switching power.

The switch signal generator 103 generates a PWM timing signal, an OV timing signal, a PC timing signal, and a PM timing signal from the light source modulation pulse signal and the power modulation control pulse signal output from the pulse generator 102.

The PWM timing signal is a pulse signal generated by delaying the light-source modulation pulse signal. The PWM timing signal is a pulse signal that turns on and turns off an application of the emission current to the light source 200 (LD). Further, the PWM timing signal is also a pulse signal that turns on and turns off an application of the threshold current to the light source 200 (LD). The OV timing signal is a pulse signal generated by delaying the light-source modulation pulse signal. The OV timing signal turns on and turns off an application of the overshoot current to the light source 200 (LD). The PC timing signal is a pulse signal generated by delaying the light-source modulation pulse signal. The PC timing signal turns on and turns off an application of the precharge current to the light source 200 (LD). As described above, the PWM timing signal, the OV timing signal, and the PC timing signal are signals obtained by delaying the light-source modulation pulse signal. The PM timing signal is a pulse signal generated by delaying the power-modulation control pulse signal. The PM timing signal switches the emission current value applied to the light source 200 (LD). The PM timing signal also switches the overshoot current value applied to the light source 200 (LD).

Figure 18A:
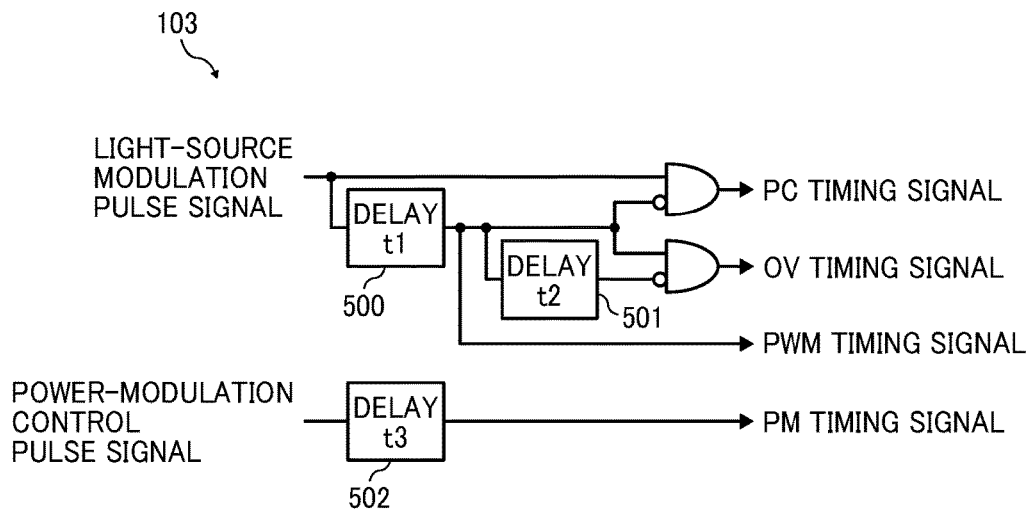
FIGS. 18A and 18B are circuit diagrams of an example of a switch signal generator 103 in the first embodiment.
Figure 18B:
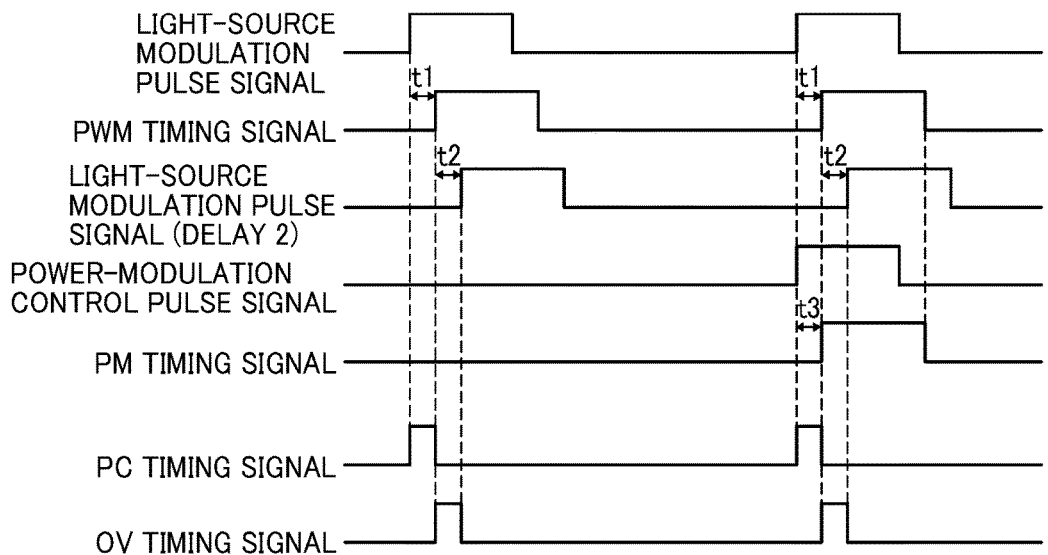

FIGS. 18A and 18B are a circuit diagram and a timing chart of an example of a switch signal generator 103 in the first embodiment. As illustrated in FIG. 18A, the switch signal generator 103 generates the PC timing signal, the OV timing signal, the PWM timing signal, and the PM timing signal by delaying the light-source modulation pulse signal or the power-modulation control pulse signal.

As illustrated in FIGS. 18A and 18B, the PWM timing signal is generated by delaying the light-source modulation pulse signal by one stage (delayed by t1 time) by a delay circuit 500. The OV timing signal is generated using a signal obtained by delaying the light-source modulation pulse signal by one stage (delayed by t1 time) by the delay circuit 500 and a signal obtained by delaying the light-source modulation pulse signal by two stages (delayed by t1+t2 times) by the delay circuits 500 and a delay circuit 501. The PC timing signal is generated using the light-source modulation pulse signal and a signal obtained by delaying the light-source modulation pulse signal by one stage (delayed by t1 time) by the delay circuit 500. The PM timing signal is generated by delaying the power-modulation control pulse signal by one stage (delayed by t3 time). The delay amount t3 of the PM timing signal is about the same as the delay amount t1 for the light-source modulation pulse signal.

Referring back to FIG. 17, the precharge current setting unit 111 holds a PC current setting value and outputs the PC current setting value to the light-source driver 104. The threshold current setting unit 116 derives a threshold current setting value and outputs the threshold current setting value to the light-source driver 104. Since the precharge current and the threshold current do not fluctuate at time of power modulation, the PM timing signal is not switched.

The normal current setting unit 115 calculates an emission current setting value to be applied to the light source 200 (LD) based on a feedback value of the light quantity from the integrated light-quantity calculation unit 105 so that an output of the light source 200 (LD) becomes the target light quantity. Then, the normal current setting unit 115 outputs the emission current set value at normal time to the selector 118.

The overshoot current setting section 0 (113-0) executes the adjustment process of the overshoot current value as illustrated in FIG. 7 based on the feedback value of the light quantity from the integrated light-quantity calculation unit 105 and derives the optimum overshoot current value at the time of a normal light quantity. Then, the overshoot current setting section 0 (113-0) outputs the OV current set value at the normal time to the selector 117.

Thus, the feedback signal corresponds to a signal obtained by integrating electric signals output from a photodetector PD 300 that detects the light emitted from the light source 200 (LD).

The power-modulation value holding unit 112 outputs a power-modulation ratio set value to the power-modulation current setting unit 114 and the overshoot current setting unit 1 (113-1) based on the setting signal input from outside of the light-source control device 100. The power-modulation ratio set value indicates how many times the light quantity at time of power modulation is multiplied by the normal light quantity. The power-modulation ratio setting value may be dynamically calculated and set from a register or may be set from an LUT (Lookup table) held in a memory.

The power-modulation current setting unit 114 calculates the power-modulation current set value based on the emission current set value and the power-modulation ratio set value at the normal time and outputs the calculated power-modulation current set value to the selector 118.

The overshoot current setting unit 1 (113-1) calculates the OV current set value at the time of power modulation from the overshoot current value for the normal light quantity of the overshoot current setting unit 0 (113-0) and the power-modulation ratio set value and outputs the calculated OV current set value to the selector 117.

The selectors 117 and 118 switch a set value at the normal time or a set value at the time of power modulation according to the PM timing signal output from the switch signal generator 103. The selectors 117 and 118 select "0" as indicated inside the selectors 117 and 118 in FIG. 17 at the normal time. The selectors 117 and 118 select "1" as indicated inside the selectors 117 and 118 in FIG. 17 at the time of power modulation. The emission current set value and the OV current set value are selected by a common PM timing signal. Details of the timing chart are given below.

The light-source driver 104 generates an application current for driving the light source 200 (LD) based on each current set values and each timing signals.

The light source 200 (LD) is driven by the application current generated by the light-source driver 104 and emits light. The PD 300 receives the light output from the light source 200 (LD) and outputs an electric signal to the integrated light-quantity calculation unit 105 based on the received light. The integrated light-quantity calculation unit 105 outputs a feedback value based on an electric signal output from the PD 300 to the application current setting unit 110 and the phase synchronization circuit 41 (see FIG. 13).

Figure 19A:
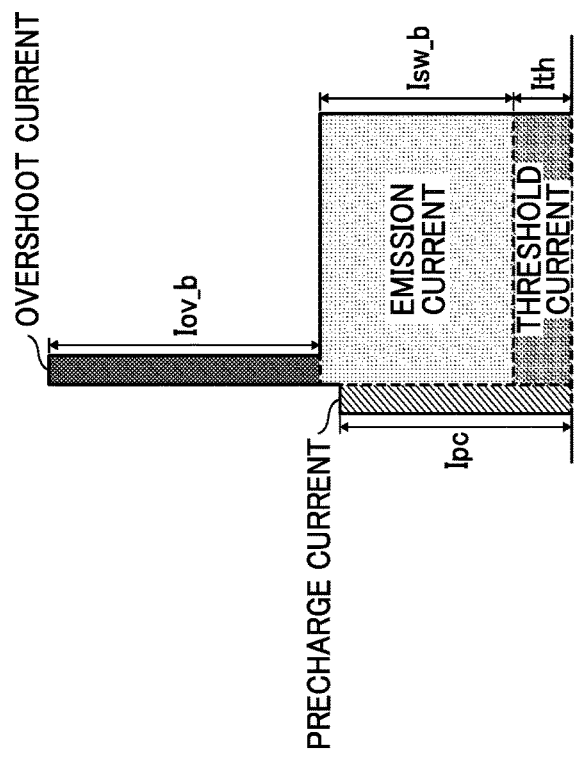
FIGS. 19A and 19B are graphs of the optical waveform of the overshoot current at time of magnification of the emission current in the first embodiment.
Figure 19B:
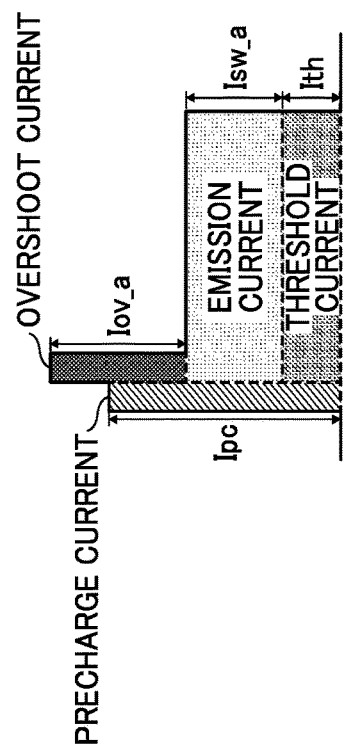

FIGS. 19A and 19B are graphs of the optical waveform of the overshoot current at time of magnification of the emission current in the first embodiment. The current waveform illustrated in FIG. 19A illustrates a reference current, that is, a current when a pixel is formed at the normal time. The current waveform illustrated in FIG. 19B illustrates a current when a pixel is formed by the power modulation in which the light is emitted by magnifying the emission current of the reference current. The set value of the overshoot current (Iov-a) of the reference current is derived by the adjustment of the overshoot current as illustrated in FIGS. 7, 8, and 9. The overshoot current (Iov-a) indicates a current value at the normal time. The same applies hereinafter.

Next, the power modulation at the time of magnification of the emission current is described below. The set value may be derived by executing the adjustment process of the overshoot current while applying the magnified emission current (Isw_b). However, it is necessary to perform the adjustment of the overshoot current for each emission current when a plurality of emission currents is used. Thus, it takes time to derive the set value of each overshoot currents. Thus, a method is required that enables a calculation of the overshoot current (Iov_b) at the time of power modulation in a short time.

Thus, the overshoot current (Iov_b) at the time of power modulation is calculated by integrating (multiplying) a magnification ratio K to the overshoot current (Iov-a) of the reference current in the first embodiment. The magnification ratio K when the emission current is magnified from Isw_a to Isw_b is calculated by dividing the emission current Isw_b at the time of power modulation by the emission current Isw_a at the normal time (=Isw_b/Isw_a). The precharge current substantially charges the parasitic capacitance before applying the emission current. Further, the emission current value is substantially proportional to the optimum overshoot current value. Thus, the calculation of the overshoot current (Iov_b) can be calculated as described above. Further, to correct the delay and dullness of the optical waveform only by the overshoot current without applying the precharge current, the parasitic capacitance has to be charged only by the overshoot current without the overshoot current. Thus, the emission current value becomes not proportional to the optimum overshoot current value. Therefore, the overshoot current (Iov_b) may not be calculated by using the magnification ratio K.

As described above, the light-source control device 100 calculates the overshoot current value at the time of power modulation by using the magnification ratio K of the emission current. Thus, calculation of the overshoot current can be completed in a shorter time than a conventional method even when using and switching the plurality of light quantity.

Figure 20:
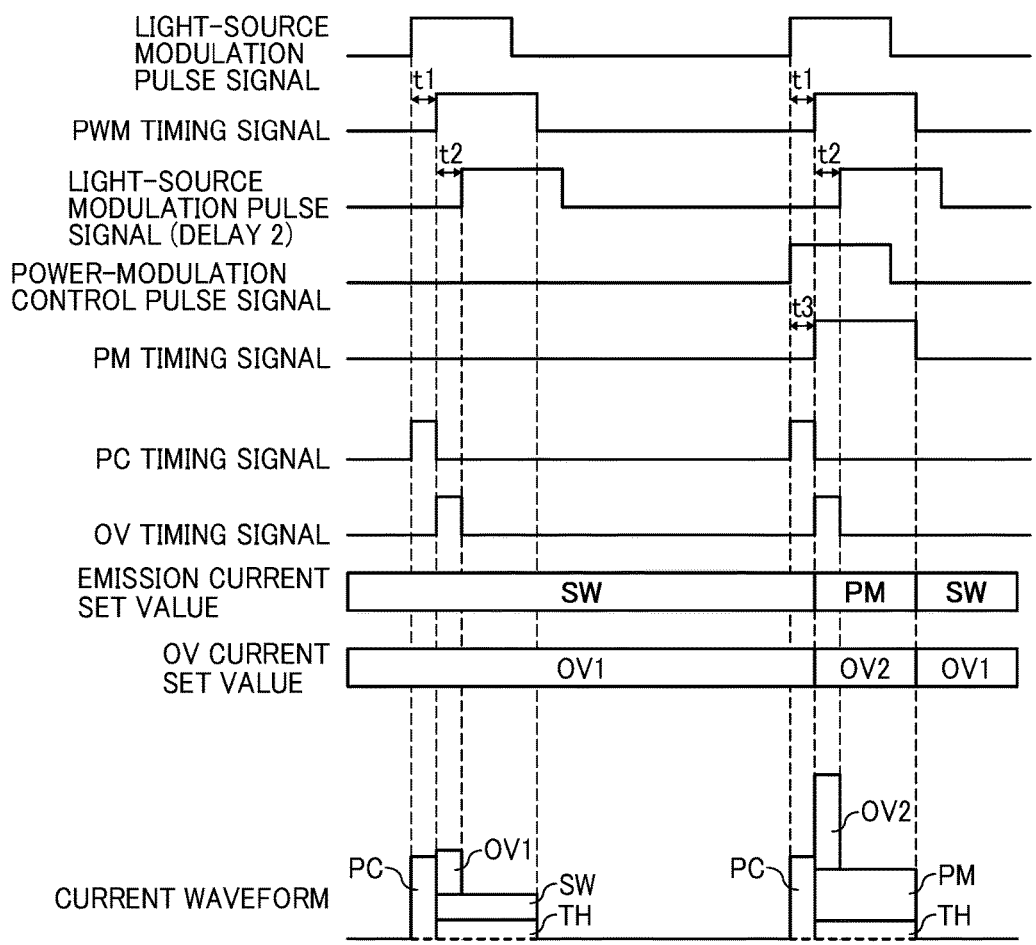
FIG. 20 is an example of a timing chart for generating the current waveform according to the first embodiment.

FIG. 20 is an example of a timing chart of generation of the current waveform according to the first embodiment. FIG. 20 illustrates timing at which each timing signal and each current set value is switched and a synthesized current waveform finally applied to the light source 200 (LD).

As described in FIG. 17, the emission current set value and the OV current set value are switched according to the PM timing signal. "SW" indicated in FIG. 20 is the emission current set value at the normal time, "PM" is the emission current set value at the time of power modulation, and "TH" is the threshold current set value. "PC" is a precharge current set value, and "OV1" and "OV2" are the OV current set values. As illustrated in FIG. 20, the OV current, the emission current, the threshold current, and the precharge current are generated when corresponding timing signals (the PWM timing signal, PC timing signal, and the OV timing signal) are in a state of "High (H)". If a period of "H" of the respective timing signals overlap, the corresponding currents are synthesized and a final current waveform is generated. Here, the OV current set value OV2 is calculated by multiplying (integrating) the OV current set value OV1 by a magnification ratio K (PM/SW) since the magnification ratio K is calculated by dividing the emission current set value PM at the time of the power modulation by the emission current set value SW at the normal time (PM/SW). The delay time t1, t2 and t3 indicated in FIG. 20 correspond to the delay amounts t1, t2 and t3 of the pulse signal illustrated in FIG. 18, respectively.

As described above, according to the first embodiment, the light-source control device 100 calculates the overshoot current value at the time of power modulation by using the magnification ratio K of the emission current. Thus, the calculation of the overshoot current can be completed in a shorter time than a conventional method even when using and switching the plurality of emission current. Thus, the light-source control device 100 can calculate and set the overshoot current suitable for each light quantity in a short time when a plurality of light quantity is switched and used during printing.

In the present embodiment, the overshoot current is an example of a correction current. A pixel at the normal time is an example of a first pixel. A pixel at the time of power modulation is an example of a second pixel. The PD 300 is an example of a photodetector. The feedback value of the light quantity is an example of a feedback signal. The precharge current is an example of the charging current. The light-source control device 100 is an example of a light-source controller.

As described above, in a first embodiment of the present disclosure, the light-source control device 100 includes circuitry to: apply a threshold current, a first emission current, and a first correction current to a light source 200 (LD) to drive the light source 200 to emit light to form a first pixel, the first correction current correcting the first emission current during application of the first emission current to the light source 200, apply a threshold current, a second emission current, and a second correction current to a light source to drive the light source 200 to emit light to form a second pixel, the second correction current correcting the second emission current during application of the second emission current to the light source 200, and calculate a value of the second correction current (OV2) by multiplying a value of the first correction current (OV1) by a ratio (magnification ration K (PM/SW)) of a value of the second emission current (PM) to a value of the first emission current (SM), the value of the second emission current being greater than the value of the first emission current.

A second embodiment of the present disclosure is described below with reference to FIG. 21. A difference between the second embodiment and the first embodiment is described below. Thus, other configurations of the second embodiment not described below may be identical to the first embodiment as described above.

Figure 21:
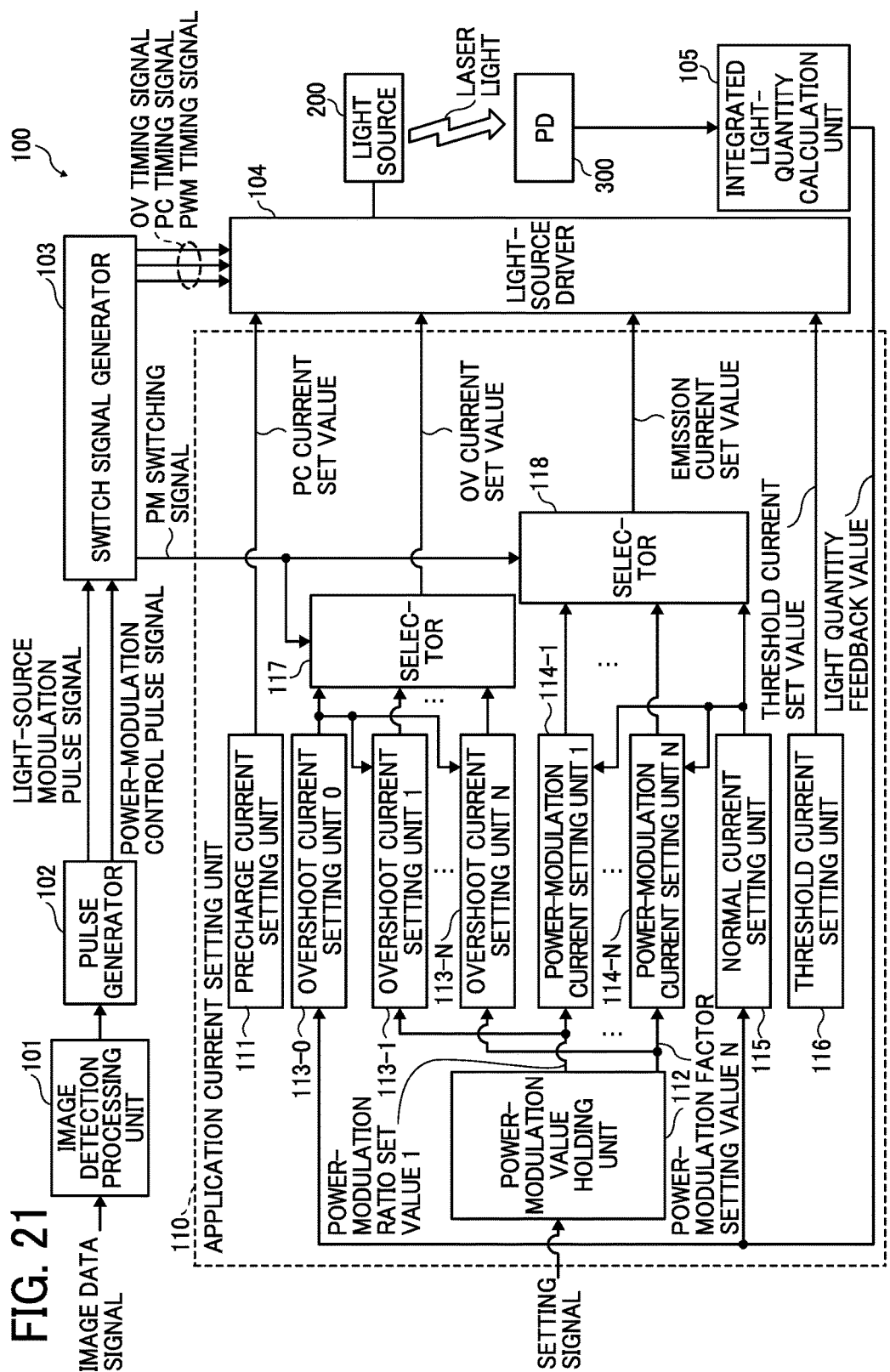
FIG. 21 is a circuit diagram of a configuration of the light-source control device according to a second embodiment.

FIG. 21 is a circuit diagram of a functional configuration of the light-source control device 100 according to a second embodiment. In FIG. 17, the application current setting unit 110 according to the first embodiment includes one power-modulation current setting unit 114. However, as illustrated in FIG. 21, the application current setting unit 110 includes a plurality (N) of a power modulation current setting unit 1 (114-1) through a power modulation current setting unit N (114-N). The application current setting unit 110 further includes a plurality (N) of an overshoot current setting unit 0 (113-0) through an overshoot current setting unit N (113-N). A number of overshoot current setting unit N (113-N) increases in a same way as the increase of the power-modulation current setting unit N (114-N). The power-modulation ratio set values 1 through N are output from the power-modulation value holding unit 112 independently for each power-modulation current setting unit N (113-N). A common value is set for each pair of the power modulation current setting unit k (114-*k*) and the overshoot current setting unit k (113-*k*) while the value of k is from 1 to N.

As described above, according to the second embodiment, the light-source control device 100 includes a plurality of sets of the power-modulation current setting unit 114 and the overshoot current setting unit 113. In the second embodiment, a plurality of power-modulation currents can be switched at high speed since the power-modulation value holding unit 112 independently outputs the power-modulation rate set value to each set of the power-modulation current setting unit 114 and the overshoot current setting unit 113. Thus, the second embodiment facilitates a plurality of light quantity during one scan.

A third embodiment of the present disclosure is described below with reference to FIG. 22. In the third embodiment, points different from the first embodiment is described. Thus, other configurations of the second embodiment not described below may be identical to the first embodiment as described above.

Figure 22:
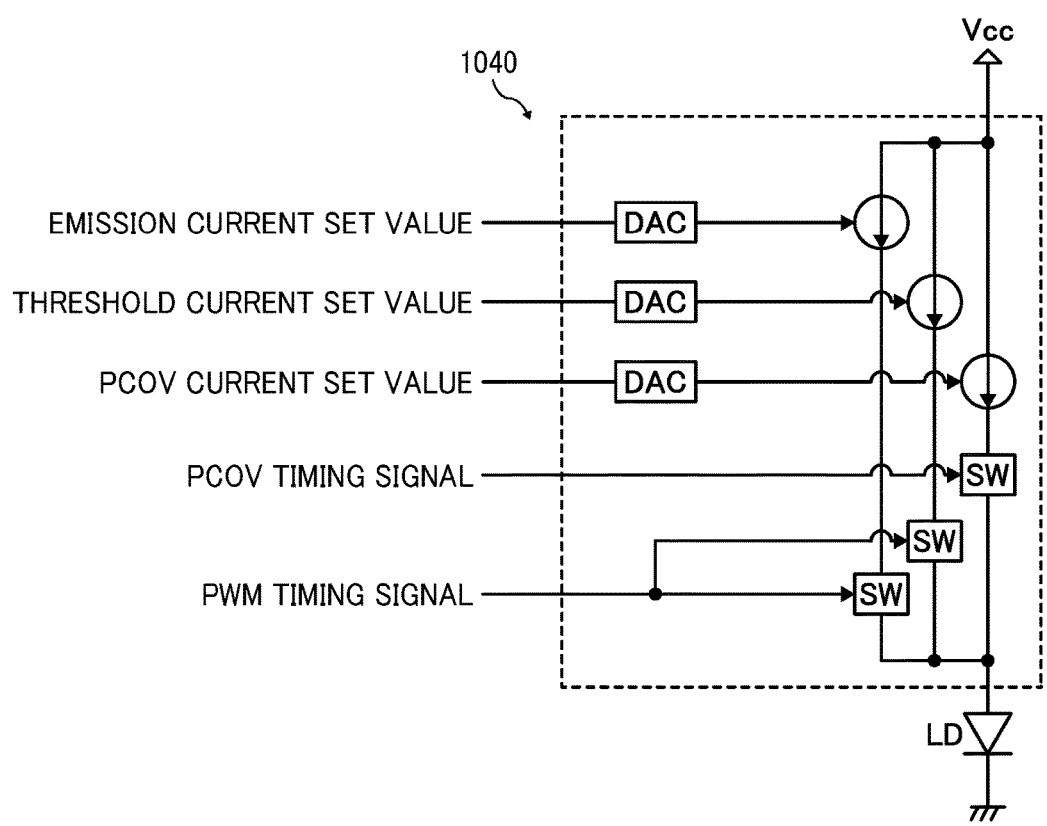
FIG. 22 is a circuit diagram of a configuration of the light-source control device according to a third embodiment.

FIG. 22 is a circuit diagram of an example of a hardware configuration of the light-source driving circuit 1040 in a third embodiment. The hardware configuration of the light-source driving circuit 1040 in the third embodiment as illustrated in FIG. 22 differs from the light-source driving circuit 1040 as illustrated in FIG. 15 in a configuration of the light-source modulation pulse signal and the light-source application current data. The light-source modulation pulse signal includes "a PCOV timing signal" and "a PWM timing signal", and the light-source application current data includes "a PCOV current set value", "an emission current set value", and "a threshold current set value".

As illustrated in FIG. 22, the light-source driving circuit 1040 integrates a current source for precharge current and a current source for overshoot current into one. The light-source driving circuit 1040 reduces a number of current sources and a circuit scale by controlling the current source based on "the PCOV timing signal" and "the PCOV current set value".

Figure 23:
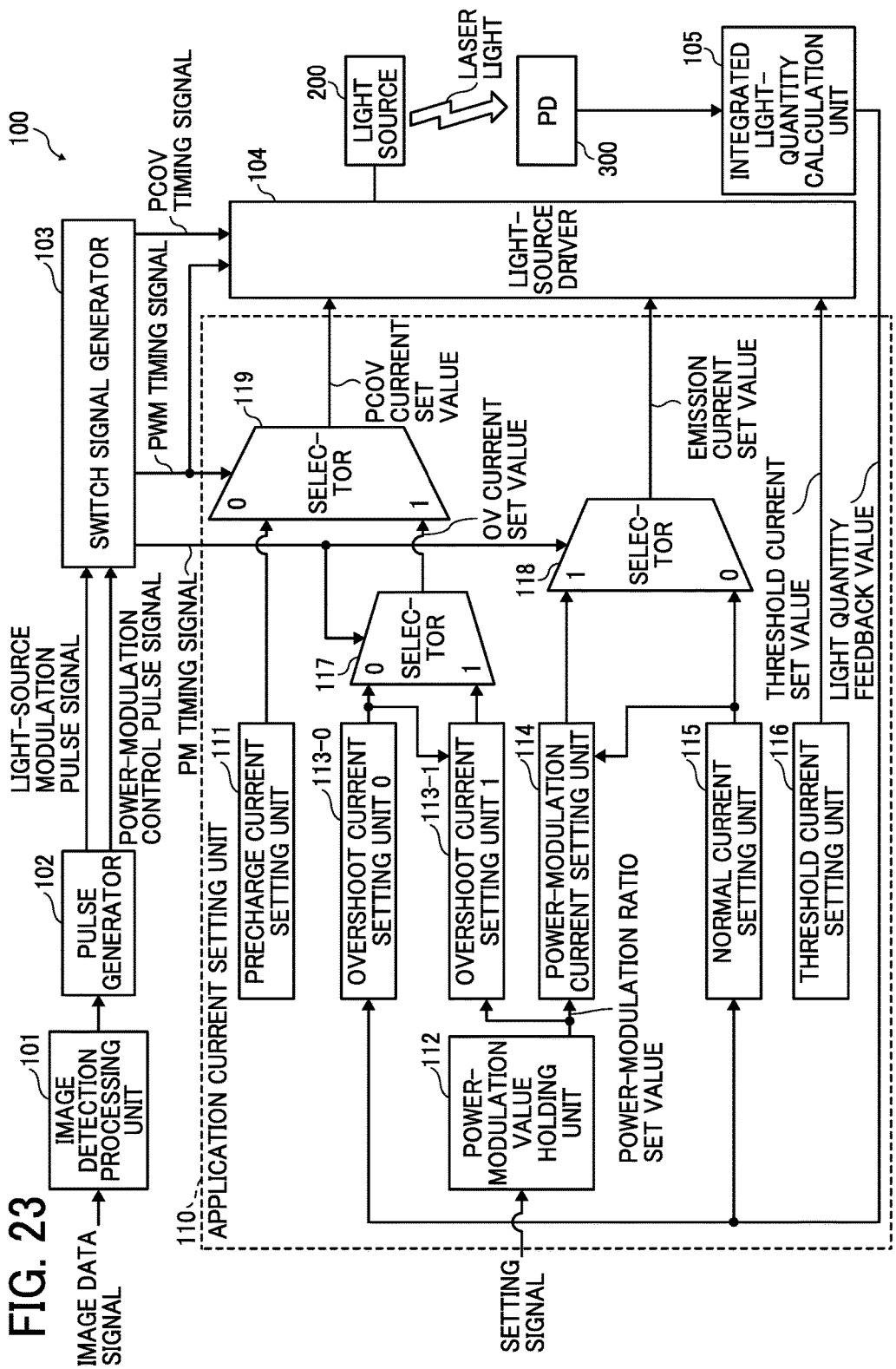
FIG. 23 is a circuit diagram of a configuration of the light-source control device according to the third embodiment.

FIG. 23 is a circuit diagram of a functional configuration of the light-source control device 100 according to the third embodiment. The timing signal output from the switch signal generator 103 in FIG. 23 is different from the timing signal output from the switch signal generator 103 of the light-source control device 100 in FIG. 17. As illustrated in FIG. 23, the switch signal generator 103 outputs the PCOV timing signal, the PWM timing signal, and the PM timing signal. The PCOV timing signal controls timing of application of both the precharge current and the overcharge current. Further, the switch signal generator 103 outputs the PWM timing signal to the selector 119 and the light-source driver 104.

Figure 24A:
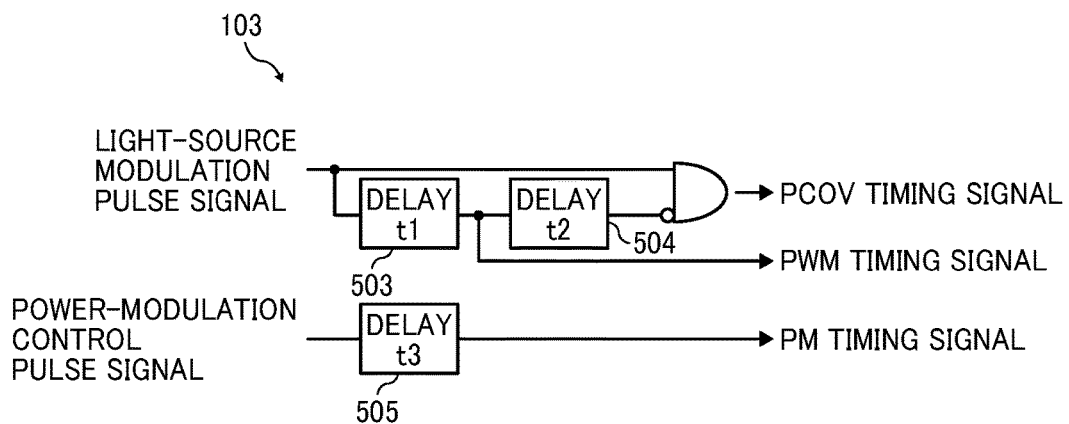
FIGS. 24A and 24B are circuit diagrams of an example of a switch signal generator in the first embodiment.
Figure 24B:
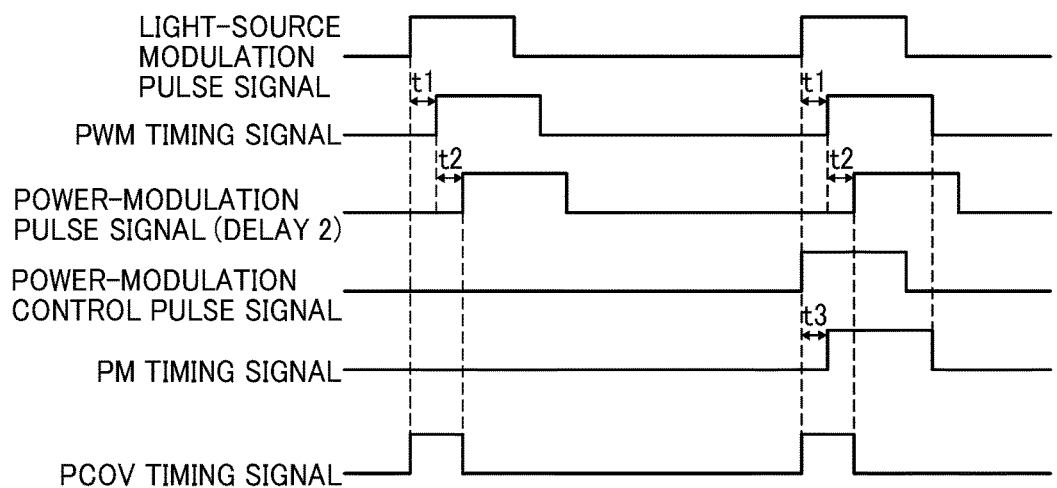

FIGS. 24A and 24B are circuit diagrams of an example of a switch signal generator 103 in the third embodiment. As illustrated in FIGS. 24A and 24B, the switch signal generator 103 generates the PCOV timing signal, the PWM timing signal, and the PM timing signal by delaying the light-source modulation pulse signal or the power-modulation control pulse signal.

As illustrated in FIGS. 18A and 18B, the PWM timing signal is generated by delaying the light-source modulation pulse signal by one stage (delayed by t1 time) by a delay circuit 500. The PCOV timing signal is generated using a light-source modulation pulse signal and a signal obtained by delaying the light-source modulation pulse signal by two stages (delayed by t1+t2 time) by delay circuits 503 and 504. The PM timing signal is generated by delaying the power-modulation control pulse signal by one stage (delayed by t3 time). The delay amount t3 of the PM timing signal is about the same as the delay amount t1 for the light-source modulation pulse signal.

Figure 25:
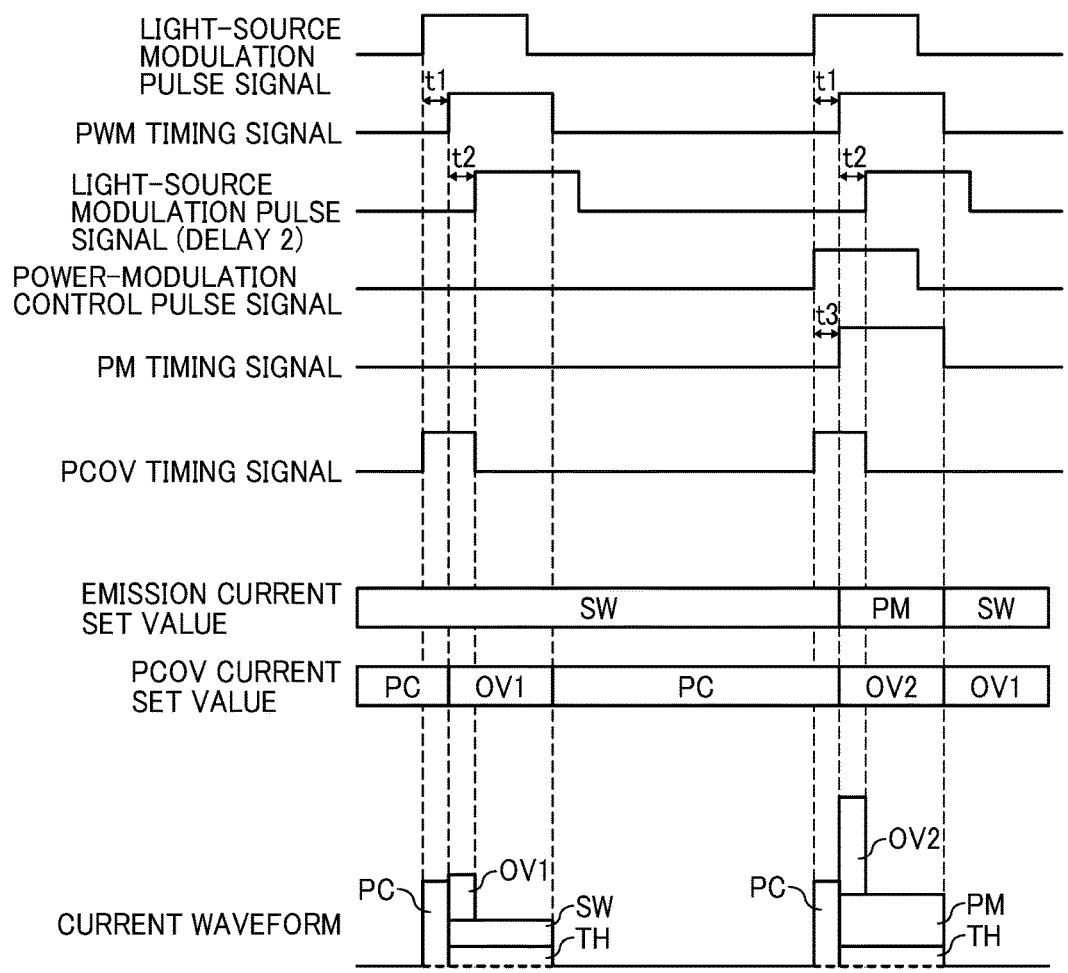
FIG. 25 is an example of a timing chart for generating a current waveform according to the third embodiment.

FIG. 25 is an example of a timing chart of generation of a current waveform according to the third embodiment. FIG. 25 illustrates timing at which each timing signal and each current set value is switched and the current waveform synthesized and finally applied to the light source.

"SW" indicated in the current waveform in FIG. 25 is the emission current set value at the normal time, "PM" is the emission current set value at the time of power modulation, and "TH" is the threshold current set value. In FIG. 25, "PC" is a precharge current set value, and "OV 1" and "OV2" are the OV current set values. As illustrated in FIG. 25, the OV current, the emission current, the threshold current, and the precharge current are generated when corresponding timing signals (the PWM timing signal and PCOV timing signal) are in a state of "High (H)". If a period of "H" of the respective timing signals overlap, the corresponding currents are synthesized and a final current waveform is generated. The PCOV timing signal controls turning ON and turning OFF of the precharge current and the overshoot current. The PWM timing signal is used for switching between the precharge current and the overshoot current. As illustrated in FIG. 25, when the PWM timing signal changes to "H", the PCOV current set value is switched from the PC current set value PC to the OV current set values OV1 or OV2. This switching of the PCOV current set value is executed by switching an output of the selector 119, to be output to the light-source driver 104, from the PC current setting value to the OV current setting value as illustrated in FIG. 23.

As similar to FIG. 20, the magnification ratio K is calculated by dividing the emission current set value PM at the time of the power modulation by the emission current set value SW at the normal time (PM/SW). Thus, the OV current set value OV2 is calculated by multiplying (integrating) the OV current set value OV1 by a magnification ratio K (PM/SW). The delay time t1, t2 and t3 indicated in FIG. 25 correspond to the delay amounts t1, t2 and t3 of the pulse signal illustrated in FIG. 24, respectively.

As described above, the light-source control device 100 according to the third embodiment integrates the current source for the precharge current and the current source for the overshoot current into one. Thus, the light-source control device 100 reduces a number of current sources and a circuit scale by controlling the light-source driver 104 based on "the PCOV timing signal" and "the PCOV current set value".

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA), and conventional circuit components arranged to perform the recited functions.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

Numerous additional modifications and variations are possible in light of the above teachings. Such modifications and variations are not to be regarded as a departure from the scope of the present disclosure and appended claims, and all such modifications are intended to be included within the scope of the present disclosure and appended claims.

What is claimed is:

1. A light source control device, comprising circuitry to:
apply a threshold current, a first emission current, and a first correction current to a light source to drive the light source to emit light to form a first pixel, the first correction current correcting the first emission current during application of the first emission current to the light source; and
apply the threshold current, a second emission current, and a second correction current to the light source to drive the light source to emit light to form a second pixel, the second correction current correcting the second emission current during application of the second emission current to the light source,
wherein the circuitry calculates a value of the second correction current by multiplying a value of the first correction current by a ratio of a value of the second emission current to a value of the first emission current, the value of the second emission current being greater than the value of the first emission current.

2. The light source control device according to claim 1, wherein the value of the first emission current and the value of the first correction current are set based on a feedback signal corresponding to light quantity of the light emitted from the light source.

3. The light source control device according to claim 2, wherein the feedback signal corresponds to a signal obtained by integrating electric signals output from a photodetector that detects the light emitted from the light source.

4. The light source control device according to claim 2, wherein the circuitry further applies a charge current to the light source immediately before applying the first emission current or the second emission current to the light source.

5. The light source control device according to claim 4, wherein a value of the charge current is fixed.

6. The light source control device according to claim 4, wherein the circuitry completes charging of a parasitic capacitance in the light source and a circuit connected to the light source with the charge current.

7. An image forming apparatus comprising:
the light source controlling device according to claim 1;

an image bearer on which a latent image is written according to light emission of the light source;

a developing device to supply toner to the latent image written on the image bearer to develop the latent image into a visible toner image;

a transfer device to transfer the visible toner image, into which the latent image is developed by the developing device, onto a recording medium; and a fixing device to fix the toner image transferred by the transfer device onto the recording medium.

8. A method of controlling a light source, comprising:

applying a threshold current, a first emission current, and a first correction current to a light source to drive the light source to emit light to form a first pixel, the first correction current correcting the first emission current during application of the first emission current to the light source; and applying the threshold current, a second emission current, and a second correction current to the light source to drive the light source to emit light to form a second pixel, the second correction current correcting the second emission current during application of the second emission current to the light source, wherein the second correction current has a value calculated by multiplying a value of the first correction current by a ratio of a value of the second emission current to a value of the first emission current, the value of the second emission current being greater than the value of the first emission current.

9. A non-transitory recording medium storing a plurality of instructions which, when executed by one or more processors, cause the processors to perform a method comprising:

applying a threshold current, a first emission current, and a first correction current to a light source to drive the light source to emit light to form a first pixel, the first correction current correcting the first emission current during application of the first emission current to the light source; and applying the threshold current, a second emission current, and a second correction current to the light source to drive the light source to emit light to form a second pixel, the second correction current correcting the second emission current during application of the second emission current to the light source, wherein the second correction current has a value calculated by multiplying a value of the first correction current by a ratio of a value of the second emission current to a value of the first emission current, the value of the second emission current being greater than the value of the first emission current.

* * * * *